US010028365B2

(12) United States Patent
Ishihara et al.

(10) Patent No.: US 10,028,365 B2
(45) Date of Patent: Jul. 17, 2018

(54) CHAMBER DEVICE, TARGET GENERATION METHOD, AND EXTREME ULTRAVIOLET LIGHT GENERATION SYSTEM

(71) Applicant: Gigaphoton Inc., Tochigi (JP)

(72) Inventors: Takanobu Ishihara, Oyama (JP); Tsukasa Hori, Oyama (JP); Takashi Saito, Oyama (JP); Yutaka Shiraishi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/697,954

(22) Filed: Sep. 7, 2017

(65) Prior Publication Data

US 2018/0007770 A1   Jan. 4, 2018

Related U.S. Application Data

(63) Continuation of application No. PCT/JP2016/061946, filed on Apr. 13, 2016.

(30) Foreign Application Priority Data

Apr. 28, 2015   (WO) .................. PCT/JP2015/062901

(51) Int. Cl.
    *H05G 2/00*     (2006.01)
    *G03F 7/20*     (2006.01)

(52) U.S. Cl.
    CPC ........... *H05G 2/006* (2013.01); *G03F 7/2004* (2013.01); *G03F 7/2008* (2013.01); *H05G 2/008* (2013.01)

(58) Field of Classification Search
    USPC ..................................................... 250/504 R
    See application file for complete search history.

(56) References Cited

U.S. PATENT DOCUMENTS

| 2002/0051728 A1 | 5/2002 | Sato et al. |
| 2009/0121156 A1* | 5/2009 | Mahoney .............. C23C 14/022 250/492.2 |

(Continued)

FOREIGN PATENT DOCUMENTS

| EP | 0 884 936 A1 | 12/1998 |
| JP | H09-232742 A | 9/1997 |

(Continued)

OTHER PUBLICATIONS

International Search Report issued in PCT/JP2016/061946; dated Jul. 5, 2016.

(Continued)

*Primary Examiner* — Kiet T Nguyen
(74) *Attorney, Agent, or Firm* — Studebaker & Brackett PC

(57) ABSTRACT

A chamber device may include a chamber, and a target generation device assembled into the chamber and configured to supply a target material into the chamber, the target generation device including a tank configured to store the target material, a temperature variable device configured to vary temperature of the target material in the tank, and a nozzle section in which a nozzle hole configured to output the target material in a liquid form is formed, and the chamber device may further include a gas nozzle having an inlet port facing the nozzle section and configured to introduce gas into the chamber, a gas supply source configured to supply gas containing hydrogen to the gas nozzle to supply the gas containing the hydrogen to at least periphery of the nozzle section, and a moisture remover configured to remove moisture at least in the periphery of the nozzle section in the chamber.

14 Claims, 24 Drawing Sheets

(56) References Cited

U.S. PATENT DOCUMENTS

| | | |
|---|---|---|
| 2009/0250641 A1 | 10/2009 | Moriya et al. |
| 2011/0007292 A1 | 1/2011 | Van Herpen et al. |
| 2011/0226745 A1 | 9/2011 | Nagai et al. |
| 2012/0305809 A1 | 12/2012 | Moriya et al. |
| 2013/0161540 A1 | 6/2013 | Nagai et al. |
| 2014/0216576 A1 | 8/2014 | Someya et al. |

FOREIGN PATENT DOCUMENTS

| | | |
|---|---|---|
| JP | 2001-267730 A | 9/2001 |
| JP | 2009-253032 A | 10/2009 |
| JP | 2010-118852 A | 5/2010 |
| JP | 2011-513987 A | 4/2011 |
| JP | 2012-169580 A | 9/2012 |
| JP | 2013-012465 A | 1/2013 |
| JP | 2013-135033 A | 7/2013 |
| JP | 2014-154229 A | 8/2014 |
| WO | 2014/090480 A1 | 6/2014 |

OTHER PUBLICATIONS

The International Preliminary Report on Patentability (Chapter I) and Translation of Written Opinion of the International Searching Authority; PCT/JP2016/061946; dated Oct. 31, 2017.

* cited by examiner

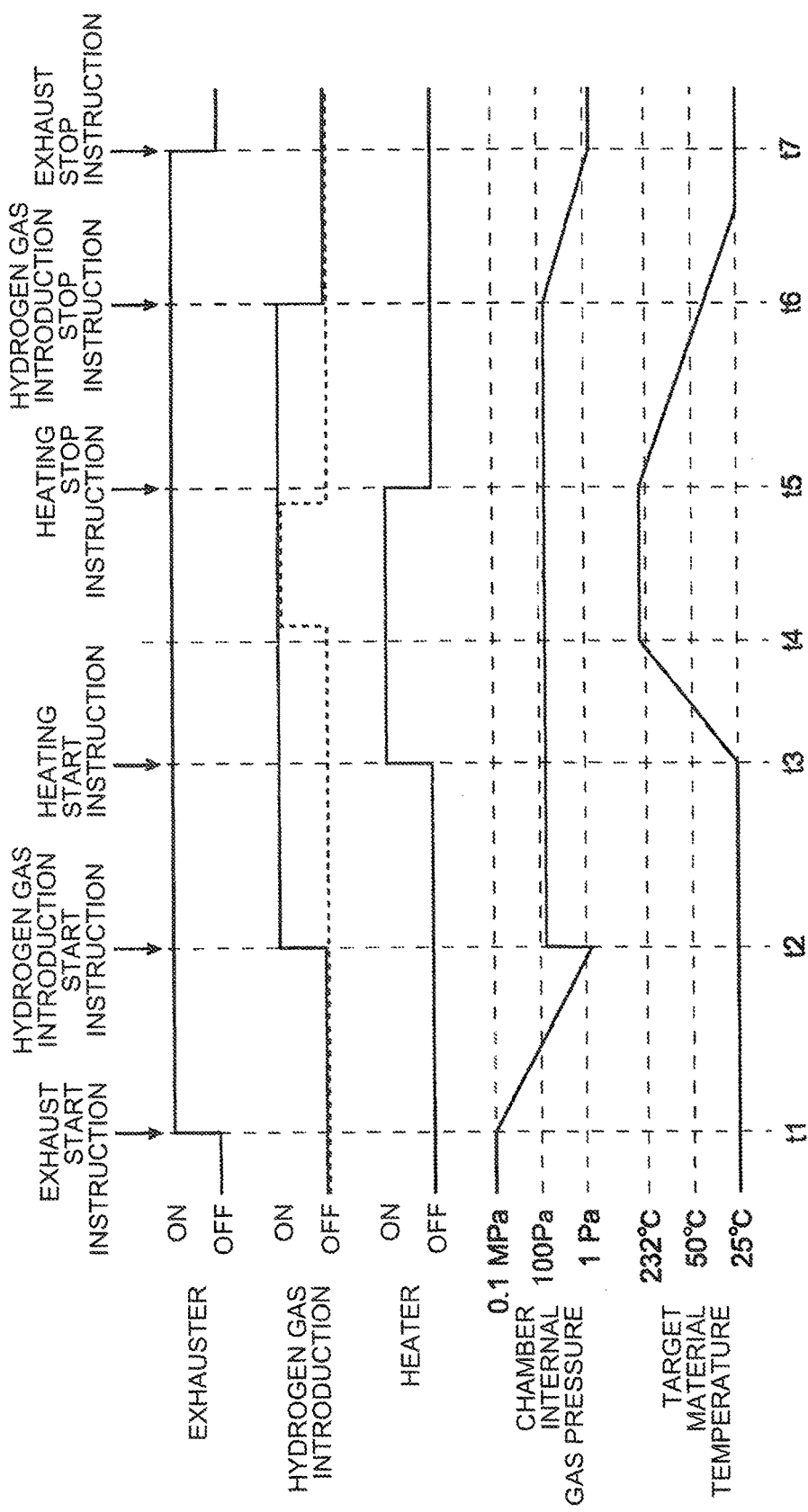

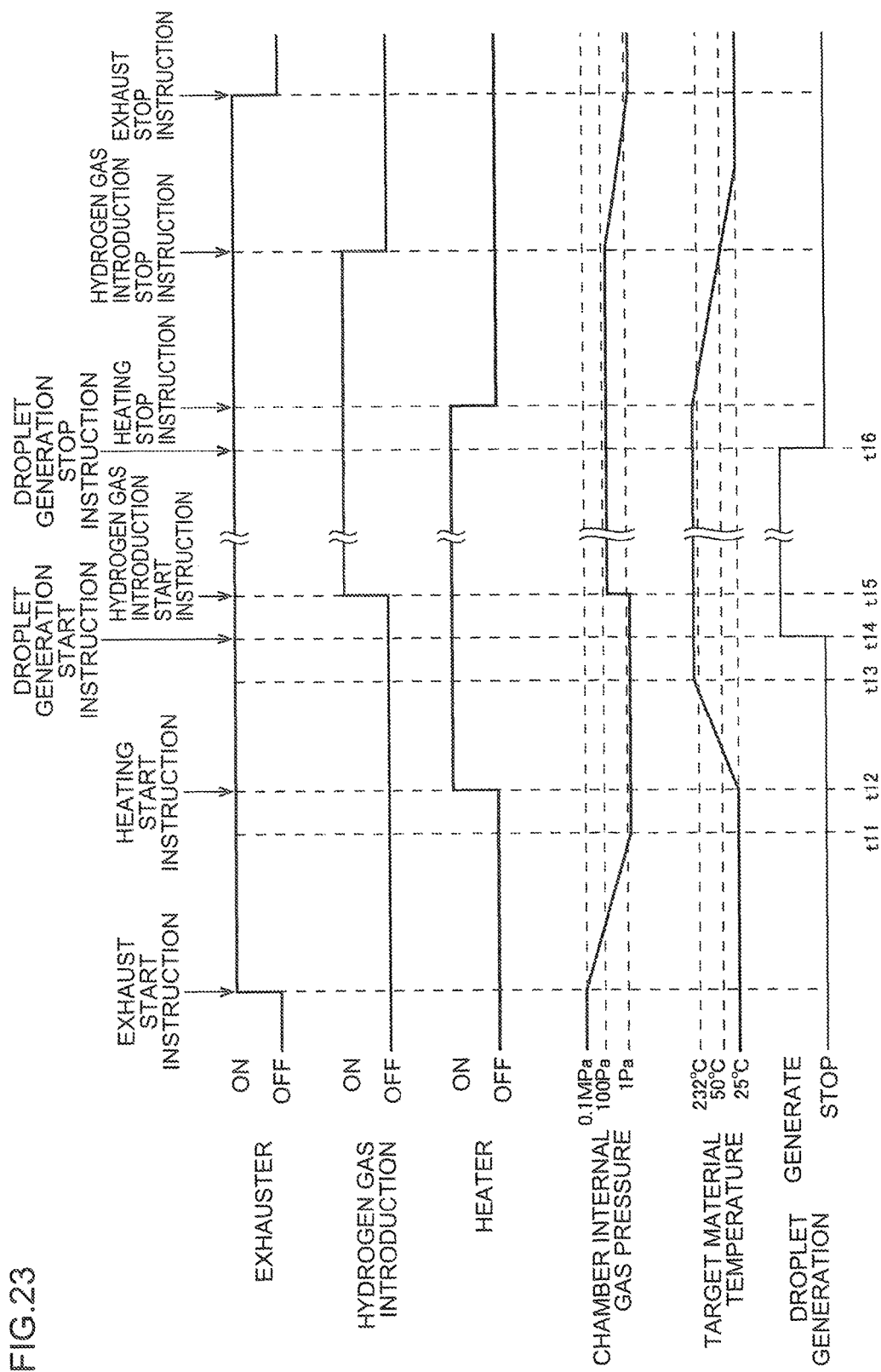

CHAMBER DEVICE, TARGET GENERATION METHOD, AND EXTREME ULTRAVIOLET LIGHT GENERATION SYSTEM

CROSS-REFERENCE TO RELATED APPLICATIONS

The present application is a continuation application of International Application No. PCT/JP2016/061946 filed on Apr. 13, 2016 claiming the priority to International Application No. PCT/JP2015/062901 filed on Apr. 28, 2015. Each of the above applications is incorporated herein by reference in its entirety.

BACKGROUND

1. Technical Field

The present disclosure relates to a chamber device, a target generation method, and an extreme ultraviolet light generation system.

2. Related Art

In recent years, along with miniaturization of a semiconductor process, miniaturization of a transfer pattern in photolithography of a semiconductor process has been developed rapidly. In the next generation, fine processing of 20 nm or less will be demanded. In order to respond to a demand for fine processing of 20 nm or less, for example, it is expected to develop an exposure device in which a device for generating extreme ultraviolet (EUV) light having a wavelength of about 13 nm and reduced projection reflective optics are combined.

As EUV light generation devices, three types of devices are proposed, namely an LPP (Laser Produced Plasma) type device using plasma generated by radiating laser light to a target substance, a DPP (Discharge Produced Plasma) type device using plasma generated by electric discharge, and an SR (Synchrotron Radiation) type device using orbital radiation light.

CITATION LIST

Patent Literature

Patent Literature 1: Japanese Patent Application Laid-Open No. 2001-267730
Patent Literature 2: Japanese Patent Application Laid-Open No. 09-232742
Patent Literature 3: Japanese National Publication of International Patent Application No. 2011-513987
Patent Literature 4: Japanese Patent Application Laid-Open No. 2010-118852

SUMMARY

A chamber device according to an aspect of the present disclosure may include a chamber, a target generation device, a gas nozzle, a gas supply source, and a moisture remover. The target generation device may be assembled into the chamber, and configured to supply a target material to a predetermined region in the chamber. The target generation device may include a tank, a temperature variable device, and a nozzle section. The tank may store the target material. The temperature variable device may be configured to vary temperature of the target material in the tank. A nozzle hole configured to output the target material in a liquid state may be formed in the nozzle section. The gas nozzle may be disposed such that an inlet port of gas faces the nozzle section. The gas supply source may be configured to supply gas containing hydrogen to the gas nozzle such that the gas containing the hydrogen is supplied to at least periphery of the nozzle section. The moisture remover may be configured to remove moisture at least in the periphery of the nozzle section in the chamber.

A target generation method according to an aspect of the present disclosure may be a method using a device. The device may include a chamber, a target generation device, a gas nozzle, a gas supply source, a moisture remover, and a controller. The target generation device may be assembled into the chamber, and configured to supply a target material to a predetermined region in the chamber. The target generation device may include a tank, a temperature variable device, and a nozzle section. The tank may store the target material. The temperature variable device may be configured to vary temperature of the target material in the tank. A nozzle hole configured to output the target material in a liquid state may be formed in the nozzle section. The gas nozzle may be disposed such that an inlet port of gas faces the nozzle section. The gas supply source may be configured to supply gas containing hydrogen to the gas nozzle such that the gas containing the hydrogen is supplied to at least periphery of the nozzle section. The moisture remover may be configured to remove moisture at least in the periphery of the nozzle section in the chamber. The controller may be configured to control the gas supply source, the temperature variable device, and the moisture remover. The method may include (a) controlling the gas supply source to start supply of the gas containing the hydrogen by the controller, (b) controlling the moisture remover to start removal of the moisture in the periphery of the nozzle section by the controller, and (c) controlling the temperature variable device to raise the temperature of the target material in the tank to allow the target material to melt by the controller, after the steps (a) and (b).

A target generation method according to an aspect of the present disclosure may be a method using a device. The device may include a chamber, a target generation device, a gas nozzle, a gas supply source, a moisture remover, and a controller. The target generation device may be assembled into the chamber, and configured to supply a target material to a predetermined region in the chamber. The target generation device may include a tank, a temperature variable device, and a nozzle section. The tank may store the target material. The temperature variable device may be configured to vary a temperature of the target material in the tank. A nozzle hole configured to output the target material in a liquid state may be formed in the nozzle section. The gas nozzle may be disposed such that an inlet port of gas faces the nozzle section. The gas supply source may be configured to supply gas containing hydrogen to the gas nozzle such that the gas containing the hydrogen is supplied to at least periphery of the nozzle section. The moisture remover may be configured to remove moisture at least in the periphery of the nozzle section in the chamber. The controller may be configured to control the gas supply source, the temperature variable device, and the moisture remover. The method may include (a) controlling the moisture remover to start removal of the moisture in the periphery of the nozzle section by the controller, (b) controlling the temperature variable device to raise the temperature of the target material in the tank so as to allow the target material to melt and allow the molten target material in the tank to be output from the nozzle hole by the controller, and (c) controlling the gas supply source to start supply of the gas containing the hydrogen by the controller, after the steps (a) and (b).

An extreme ultraviolet light generation system according to an aspect of the present disclosure may include a chamber, a target generation device, a gas nozzle, a gas supply source, a moisture remover, a laser device, and a focusing mirror. The target generation device may be assembled into the chamber, and configured to supply a target material to a predetermined region in the chamber. The target generation device may include a tank, a temperature variable device, and a nozzle section. The tank may store the target material. The temperature variable device may be configured to vary a temperature of the target material in the tank. A nozzle hole configured to output the target material in a liquid state may be formed in the nozzle section. The gas nozzle may be disposed such that an inlet port of gas faces the nozzle section. The gas supply source may be configured to supply gas containing hydrogen to the gas nozzle such that the gas containing the hydrogen is supplied to at least periphery of the nozzle section. The moisture remover may be configured to remove moisture at least in the periphery of the nozzle section in the chamber. The laser device may be configured to radiate laser light to the target material supplied into the chamber. The focusing mirror may be configured to condense and output extreme ultraviolet light emitted from plasma of the target material generated by being irradiated with the laser light.

BRIEF DESCRIPTION OF THE DRAWINGS

Some embodiments of the present disclosure will be described below as just examples with reference to the accompanying drawings.

FIG. 9 is a timing chart illustrating an exemplary operation of the EUV light generation device illustrated in FIG. 7;

FIG. 23 is a timing chart illustrating an exemplary operation according to the eighth embodiment of the EUV light generation device illustrated in FIG. 7.

EMBODIMENTS

Figure 1:
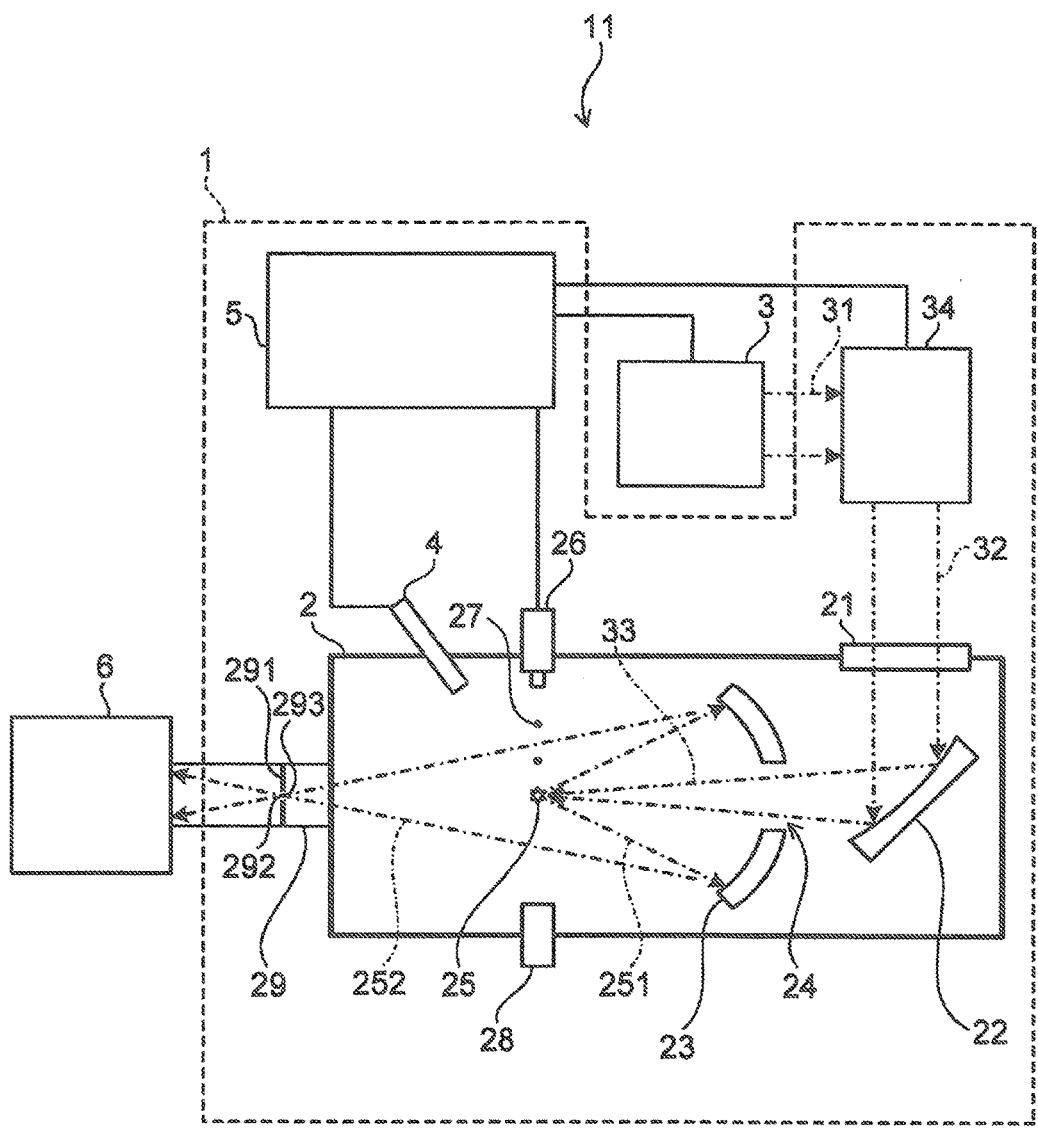
FIG. 1 is a diagram schematically illustrating a configuration of an exemplary EUV light generation system of LPP type.

Contents
1. Overview
2. Overall description of EUV light generation system
  2.1 Configuration
  2.2 Operation
3. EUV light generation device provided with target generation device: Comparative Example
  3.1 Configuration
  3.2 Operation
  3.3 Problem
4. First embodiment
  4.1 Configuration
  4.2 Operation
  4.3 Effect
5. Second embodiment
  5.1 Configuration
  5.2 Operation
  5.3 Effect
6. Third embodiment
  6.1 Configuration
  6.2 Operation
  6.3 Effect
  6.4 Modification
7. Fourth embodiment
  7.1 Configuration
  7.2 Effect 8. Fifth embodiment
8.1 Configuration
8.2 Effect
8.3 Modification
9. Sixth embodiment
9.1 Configuration
9.2 Effect
10. Seventh embodiment
10.1 Configuration
10.2 Operation
10.3 Effect
11. Eighth embodiment
11.1 Configuration
11.2 Operation
11.3 Effect Hereinafter, embodiments of the present disclosure will be described in detail with reference to the drawings. The embodiments described below illustrate some examples of the present disclosure, and do not limit the contents of the present disclosure. All of the configurations and the operations described in the embodiments are not always indispensable as configurations and operations of the present disclosure. It should be noted that the same constituent elements are denoted by the same reference numerals, and overlapping description is omitted.

1. Overview

Embodiments of the present disclosure may relate to a chamber device used in an EUV light generation device. For example, the embodiments may relate to a target generation device, a target generation method, and an extreme ultraviolet light generation device, in which formation of an oxide film on a target material exposed at the nozzle front end or the like is suppressed, whereby targets can be discharged stably.

2. Overall Description of EUV Light Generation System 2.1 Configuration

FIG. 1 schematically illustrates a configuration of an exemplary LPP type EUV light generation system. An EUV light generation device 1 may be used together with at least one laser device 3. In the present application, a system including the EUV light generation device 1 and the laser device 3 is referred to as an EUV light generation system 11. As illustrated in FIG. 1 and described below in detail, the EUV light generation device 1 may include a chamber 2 and a target supply unit 26. The chamber 2 may be sealable. The target supply unit 26 may be provided so as to penetrate a wall of the chamber 2. The material of a target substance supplied from the target supply unit 26 may include, but not limited to, tin, terbium, gadolinium, lithium, xenon, or a combination of any two or more of them.

A wall of the chamber 2 may be provided with at least one through hole. The through hole may be provided with a window 21. Pulse laser light 32 output from the laser device 3 may penetrate the window 21. Inside the chamber 2, an EUV focusing mirror 23 having a spheroidal reflection surface, for example, may be disposed. The EUV focusing mirror 23 may have first and second focuses. On the surface of the EUV focusing mirror 23, a multilayer reflection film in which molybdenum and silicon are alternately layered, for example, may be formed. It is preferable that the EUV focusing mirror 23 is disposed such that the first focus locates in the plasma generation region 25 and the second focus locates at an intermediate focal point (IF) 292, for example. The EUV focusing mirror 23 may have a through hole 24 in the center portion thereof, and the pulse laser light 33 may pass through the through hole 24.

The EUV light generation device 1 may include an EUV light generation controller 5, a target sensor 4, and the like. The target sensor 4 may have an image capturing function, and may be configured to detect presence, trajectory, position, velocity, and the like of the target 27.

The EUV light generation device 1 may also include a connecting section 29 configured to communicate the inside of the chamber 2 and the inside of an exposure device 6 with each other. In the connecting section 29, a wall 291 having an aperture 293 may be provided. The wall 291 may be disposed such that the aperture 293 locates at a second focus position of the EUV focusing mirror 23.

Moreover, the EUV light generation device 1 may also include a laser light travel direction controller 34, a laser light focusing mirror 22, a target recovery unit 28 for recovering the target 27, and the like. The laser light travel direction controller 34 may have an optical element for defining the travel direction of the laser light, and an actuator for regulating the position, posture, and the like of the optical element.

2.2 Operation

Referring to FIG. 1, the pulse laser light 31 output from the laser device 3 may pass through the laser light travel direction controller 34 and penetrate the window 21 as pulse laser light 32 to enter the chamber 2. The pulse laser light 32 may travel inside the chamber 2 along at least one laser light path, and may be reflected by the laser light focusing mirror 22 and radiated as the pulse laser light 33 to at least one target 27.

The target supply unit 26 may be configured to output the target 27 toward the plasma generation region 25 in the chamber 2. The target 27 may be irradiated with at least one pulse included in the pulse laser light 33. The target 27 irradiated with the pulse laser light is made into plasma, and from the plasma, radiation light 251 may be radiated. The EUV light 252 included in the radiation light 251 may be reflected selectively by the EUV focusing mirror 23. The EUV light 252 reflected by the EUV focusing mirror 23 may be focused at the intermediate focal point 292 and output to the exposure device 6. One target 27 may be irradiated with a plurality of pulses included in the pulse laser light 33.

The EUV light generation controller 5 may be configured to integrate the control of the entire EUV light generation system 11. The EUV light generation controller 5 may be configured to process image data or the like of the target 27 captured by the target sensor 4. Further, the EUV light generation controller 5 may be configured to control timing when the target 27 is output, output direction of the target 27, or the like, for example. Furthermore, the EUV light generation controller 5 may be configured to control the oscillation timing of the laser device 3, the travel direction of the pulse laser light 32, the light focusing position of the pulse laser light 33, and the like, for example. The various types of control described above are just examples, and another type of control can be added when necessary.

3. EUV Light Generation Device Provided with Target Generation Device: Comparative Example Next, an EUV light generation device provided with a target generation device as a comparative example will be described in detail with reference to the drawings. In the below description, constituent elements that are the same as the constituent elements illustrated in FIG. 1 are denoted by the same reference numerals, and the overlapping description is omitted.

3.1 Configuration

Figure 2:
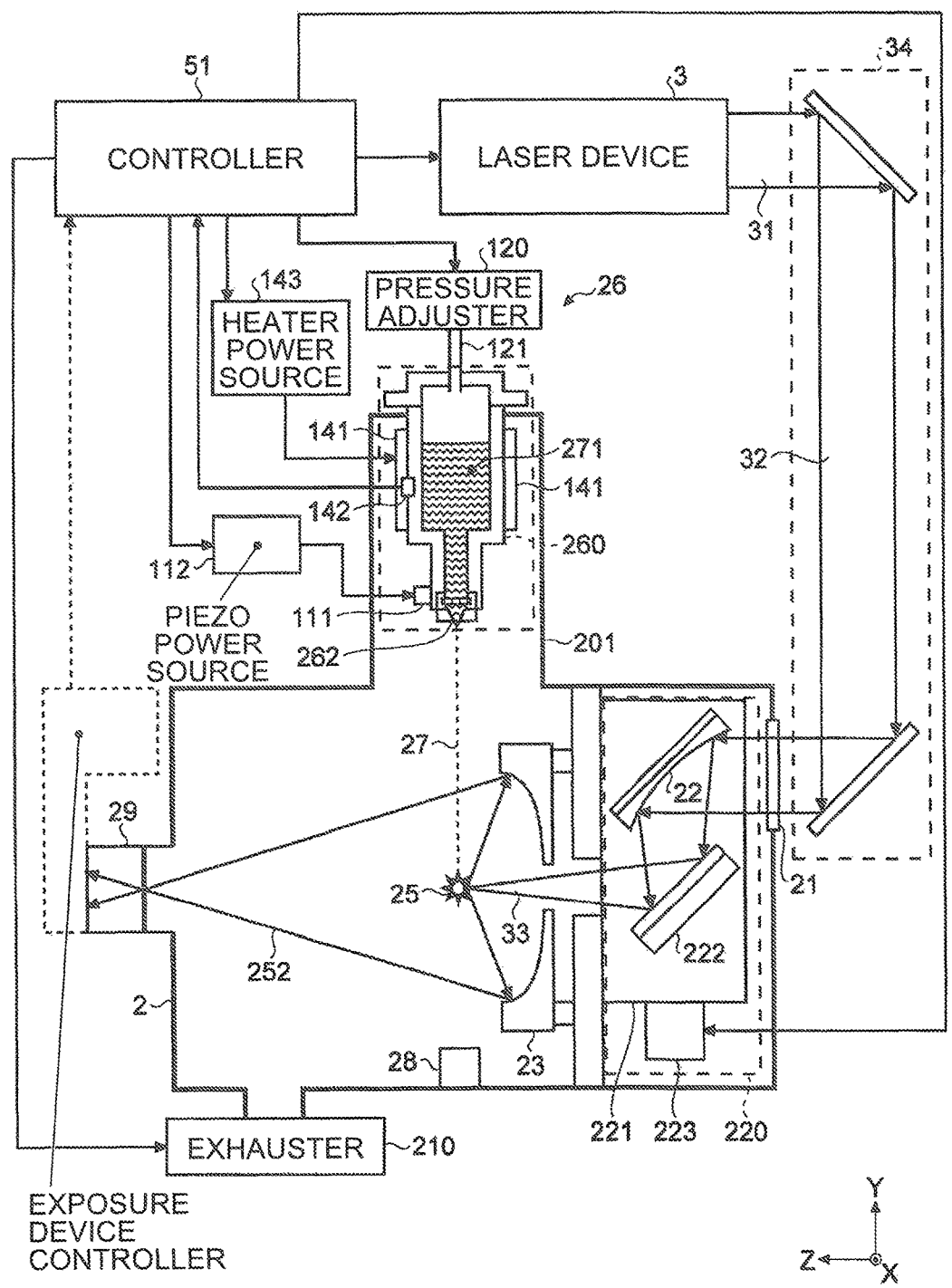
FIG. 2 is a schematic diagram illustrating an example of a schematic configuration of an EUV light generation device according to a comparative example.

FIG. 2 is a schematic diagram illustrating an example of a schematic configuration of an EUV light generation device according to a comparative example. As illustrated in FIG. 2, the EUV light generation device may include a chamber 2, a laser device 3, a laser light travel direction controller 34, and a controller 51.

The chamber 2 may include a target supply unit 26 as a target generation device, a laser focusing optical system 220 including a moving plate 221 having a laser light focusing mirror 22 and a high reflective mirror 222 thereon and a laser light manipulator 223, an EUV focusing mirror 23, a target receiver 28, and an exhauster 210.

The target supply unit 26 may be provided to a sub chamber 201 connected with the chamber 2. The target supply unit 26 may include a tank 260 for storing a target material 271 (e.g., tin), a nozzle section 262 including a nozzle hole for outputting the target material 271 as a target 27 in a droplet form, a piezo element 111 provided to the nozzle section 262, and a temperature sensor 142 and a heater 141 provided to the tank 260. The inside of the tank 260 may communicate with a pressure adjuster 120 configured to regulate the gas pressure (hereinafter referred to as tank internal pressure) via a pipe 121. The piezo element 111 may be connected with a piezo power source 112, and the heater 141 may be connected with a heater power source 143. The piezo power source 112, the pressure adjuster 120, the temperature sensor 142, and the heater power source 143 may be connected with the controller 51, respectively.

The laser focusing optical system 220 may be disposed such that laser light 32 output from the laser light travel direction controller 34 enters thereto. The laser light manipulator 223 may move the moving plate 221, on which the laser light focusing mirror 22 and the high reflective mirror 222 are fixed, in the X axis direction, the Y axis direction, and the Z axis direction such that the laser focusing position in the chamber 2 may come to a position designated by the controller 51.

3.2 Operation

At the time of maintenance or the like of the configuration illustrated in FIG. 2, the target supply unit 26 may be assembled into the chamber 2. Upon completion of assembling of the target supply unit 26, the controller 51 may operate the exhauster 210 to exhaust the air in the chamber 2. At that time, in order to exhaust moisture and oxygen, purging and exhaust may be repeated in the chamber 2. As purge gas, nitrogen ($N_2$), argon (Ar), or the like may be used.

In order to heat the target material 271 in the tank 260 to have a predetermined temperature equal to or higher than the melting point and maintain it, the controller 51 may raise the temperature of the heater 141 by allowing the electric current to flow from the heater power source 143. Alternatively, the controller 51 may regulate the amount of electric current supplied from the heater power source 143 to the heater 141 based on an output from the temperature sensor 142 to thereby control the temperature of the target material 271 to be the predetermined temperature. In the case where tin is used as the target material 271, the predetermined temperature may be in a temperature range from 250° C. to 290° C., for example.

The controller 51 may control the tank internal pressure to be a predetermined pressure by the pressure adjuster 120 such that the molten target material 271 is output from the nozzle hole of the nozzle section 262 at a predetermined velocity. The target material 271, output from the nozzle hole, may be in a jet form.

In order to generate a droplet of the target material 271, the controller 51 may apply voltage of a predetermined waveform to the piezo element 111 via the piezo power source 112. Vibration of the piezo element 111 can be propagated to a jet of the target material 271 output from the nozzle hole via the nozzle section 262. The jet of the target material 271 can be divided at a predetermined cycle by the vibration. Thereby, a droplet of the target material 271 can be generated.

The controller 51 may output a light emission trigger to the laser device 3. When a light emission trigger is input, the laser device 3 may output pulse laser light 31. The output pulse laser light 31 may be input, as pulse laser light 32, to the laser focusing optical system 220 via the laser light travel direction controller 34 and a window 21.

The controller 51 may control the laser light manipulator 223 such that the pulse laser light 32 is focused on a plasma generation region 25. Pulse laser light 33 converted to convergent light by the laser light focusing mirror 22 may be radiated to the target 27 in the plasma generation region 25. From the plasma generated by the radiation, EUV light may be generated. By radiating the pulse laser light 33 to the target 27 supplied to the plasma generation region 25 at a predetermined cycle, it is possible to generate EUV light cyclically.

As described with use of FIG. 1, the EUV light generated from the plasma generation region 25 may be focused by the EUV focusing mirror 23 at the intermediate focal point 292, and then may be input to the exposure device 6.

In order to stop discharge of the target 27, the controller 51 may stop applying voltage to the piezo element 111 and reduce the tank internal pressure up to a predetermined value. The predetermined pressure may be 0.1 MPa or lower, for example.

In order to solidify the target material 271 in the tank 260, the controller 51 may stop electric current supply from the heater power source 143 to the heater 141. Thereby, the temperature of the target material 271 may be lowered.

The controller 51 may stop the exhauster 210 after the temperature of the target material 271 becomes a predetermined temperature or lower that is equal to or lower than the solidifying point. The predetermined temperature may be 50° C. or lower, for example.

3.3 Problem

It should be noted that as the target material 271, metal being subject to oxidization such as tin may be used. In general, oxidization of tin may progress according to the following reaction formula (1):

$$Sn + O_2 = SnO_2 \qquad (1)$$

Figure 3:
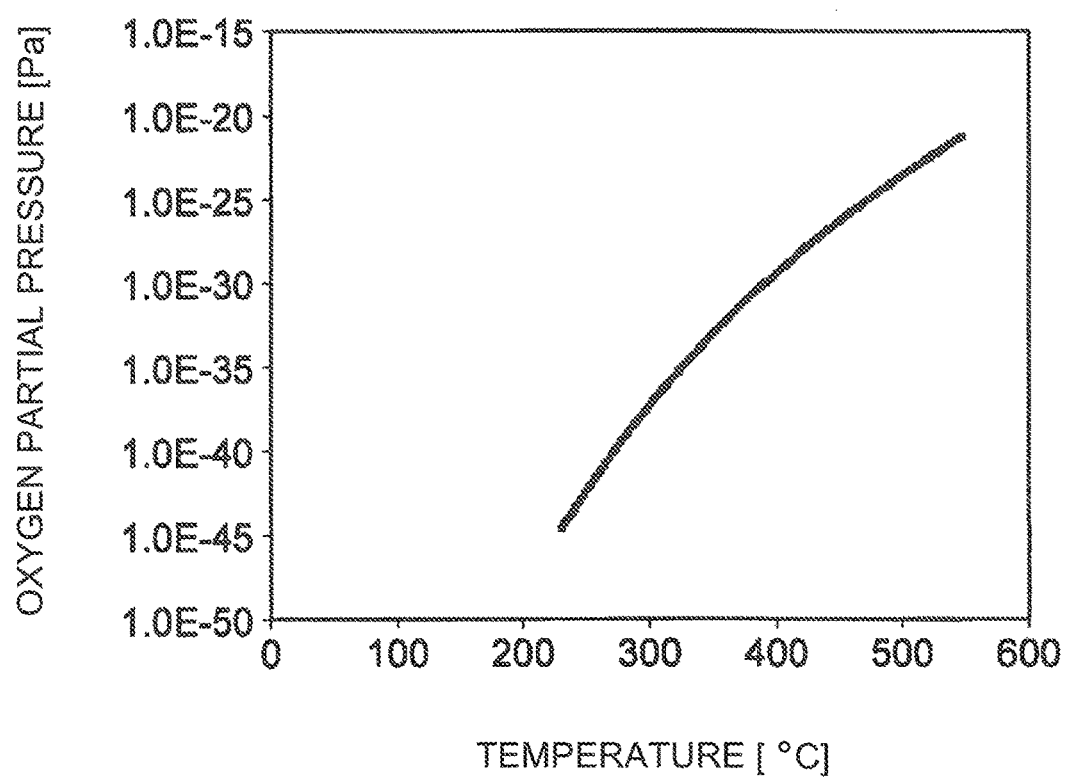
FIG. 3 is a graph illustrating a result of calculating equilibrium oxygen partial pressure (oxygen saturation partial pressure) of tin in a case where activity between tin and tin oxide is 1.

FIG. 3 illustrates a result of calculating equilibrium oxygen partial pressure (oxygen saturation partial pressure) of tin in a case where activity between tin (Sn) and tin oxide ($SnO_2$) is 1. As illustrated in FIG. 3, when the tin temperature is in a range from 250° C. to 290° C., the oxygen saturation partial pressure of the tin may range from $6 \times 10^{-43}$ Pa to $8 \times 10^{-39}$ Pa. Meanwhile, the oxygen partial pressure of the atmosphere in the chamber 2 may be $10^{-12}$ Pa when the inside of the chamber 2 is purged with high purity argon gas (oxygen concentration: 0.1 ppm) and then evacuated up to a high vacuum region of $10^{-5}$ Pa, for example. The oxygen partial pressure is larger than the oxygen saturation partial pressure of the tin by 26 digits or more. Accordingly, oxidization of the tin in contact with the atmosphere in the chamber 2 can progress.

During generation of droplets, as the surface of the tin in contact with the atmosphere in the chamber 2 from the nozzle hole of the nozzle section 262 is updated sequentially, oxidization of the surface of the tin will not progress. However, in a period when the tin is maintained at a high temperature without generating any droplets, oxidization of the surface of the tin can progress. Periods when the tin is maintained at a high temperature without generating any droplets may include a tin temperature rising period, a target discharge standby period after the temperature rising period, a tin temperature falling period after the target discharge is stopped, and the like.

When the tin in contact with the atmosphere in the chamber 2 is oxidized in the nozzle section 262, a tin oxide film that is a solid may be formed. The tin oxide may cause clogging of the nozzle hole. Even if clogging is not caused, the tin oxide may adhere to the outer periphery of the nozzle hole. Here, examples of tin oxide formed near the nozzle hole will be described using FIGS. 4 to 6.

The target material 271 stored in the tank 260 of the target supply unit 26 assembled into the chamber 2 may be tin in an ingot form. Before a tin ingot melts, spaces may exist between the tin ingot and the inner wall of the tank 260, and inside the nozzle section 262. Then, when the tin ingot melts and is output as a droplet, no spaces may exist between the molten tin and the inner wall of the tank 260, and inside the nozzle section 262.

Figure 4:
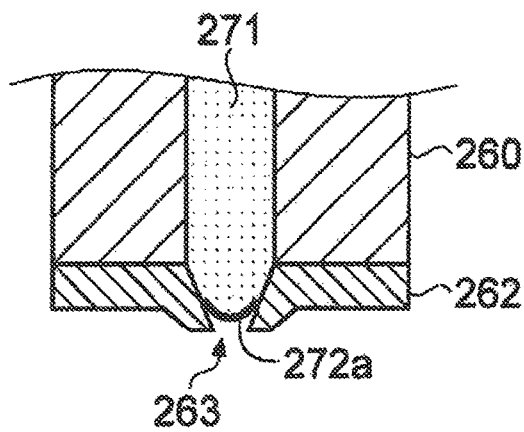
FIG. 4 is a diagram illustrating an example of tin oxide formed on a surface of tin stored in a tank in a tin temperature rising period.

FIG. 4 is a diagram illustrating an example of tin oxide that is made in such a manner that after the target supply unit 26 is assembled into the chamber 2, a tin ingot melts and is solidified, and then in a temperature rising period when the solid tin melts again, the tin oxide is formed on the surface. When the temperature of the tin rises, there is a case where the tin is drawn into a nozzle hole 263 due to contraction made at the time of solidification after the previous melting. In that case, as illustrated in FIG. 4, the surface of the tin may be oxidized in the nozzle hole 263 to be in a state where a tin oxide film 272a is formed.

Figure 5:
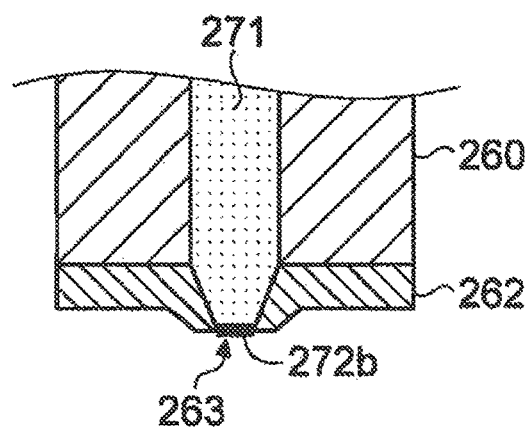
FIG. 5 is a diagram illustrating an example of tin oxide formed on the surface of the tin in a standby period after temperature of the tin rises.

FIG. 5 is a diagram illustrating an example of tin oxide formed on the surface of the tin in a standby period after the temperature rise of the tin. As such, the inside of the nozzle hole 263 may be filled with molten tin. In such a state, a tin oxide film 272b may be formed on the surface of the tin exposed from the nozzle hole 263. It should be noted that the surface of the tin exposed from the nozzle hole 263 may be a plane or a hemisphere, depending on the relationship between the tank internal pressure and the chamber internal pressure or a droplet generation stopping state.

Figure 6:
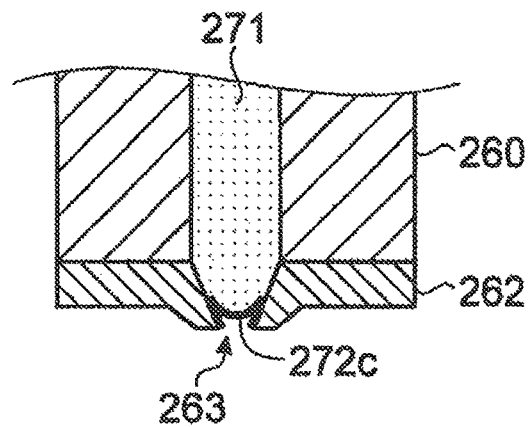
FIG. 6 is a diagram illustrating an example of tin oxide formed on the surface of the tin when temperature of molten tin is lowered and the molten tin is solidified.

FIG. 6 illustrates an example of tin oxide formed on the surface of the tin in a tin temperature dropping period. As described above, at the time of solidification, tin may be drawn into the nozzle hole 263 by the contraction. At that time, when the tin oxide film 272b is formed on the tin as illustrated in FIG. 5, a tin oxide film 272c may be formed from the inner wall of the nozzle hole 263 through the surface of the tin.

As described above, tin oxide may be formed near the nozzle hole 263 in a temperature rising period, a standby period, and a temperature dropping period. When the tin oxide adheres to the outer periphery of the nozzle hole 263, the trajectory of the target 27 (droplet) discharged from the nozzle hole 263 may be changed. If a change of the trajectory is large, a trouble that the target 27 does not pass through the plasma generation region 25 so that the pulse laser light 33 is not radiated may be caused. As such, the embodiment provided below exemplarily illustrates a target generation device, a chamber device, a target generation method, and an EUV light generation device, in which oxide of the target material 271 formed near a nozzle hole can be reduced.

4. First Embodiment

First, a target generation device, a chamber device, a target generation method, and an EUV light generation device, according to a first embodiment, will be described in detail with reference to the drawings. In the below description, constituent elements that are the same as the constituent elements described above are denoted by the same reference numerals, and the overlapping description is omitted.

4.1 Configuration

Figure 7:
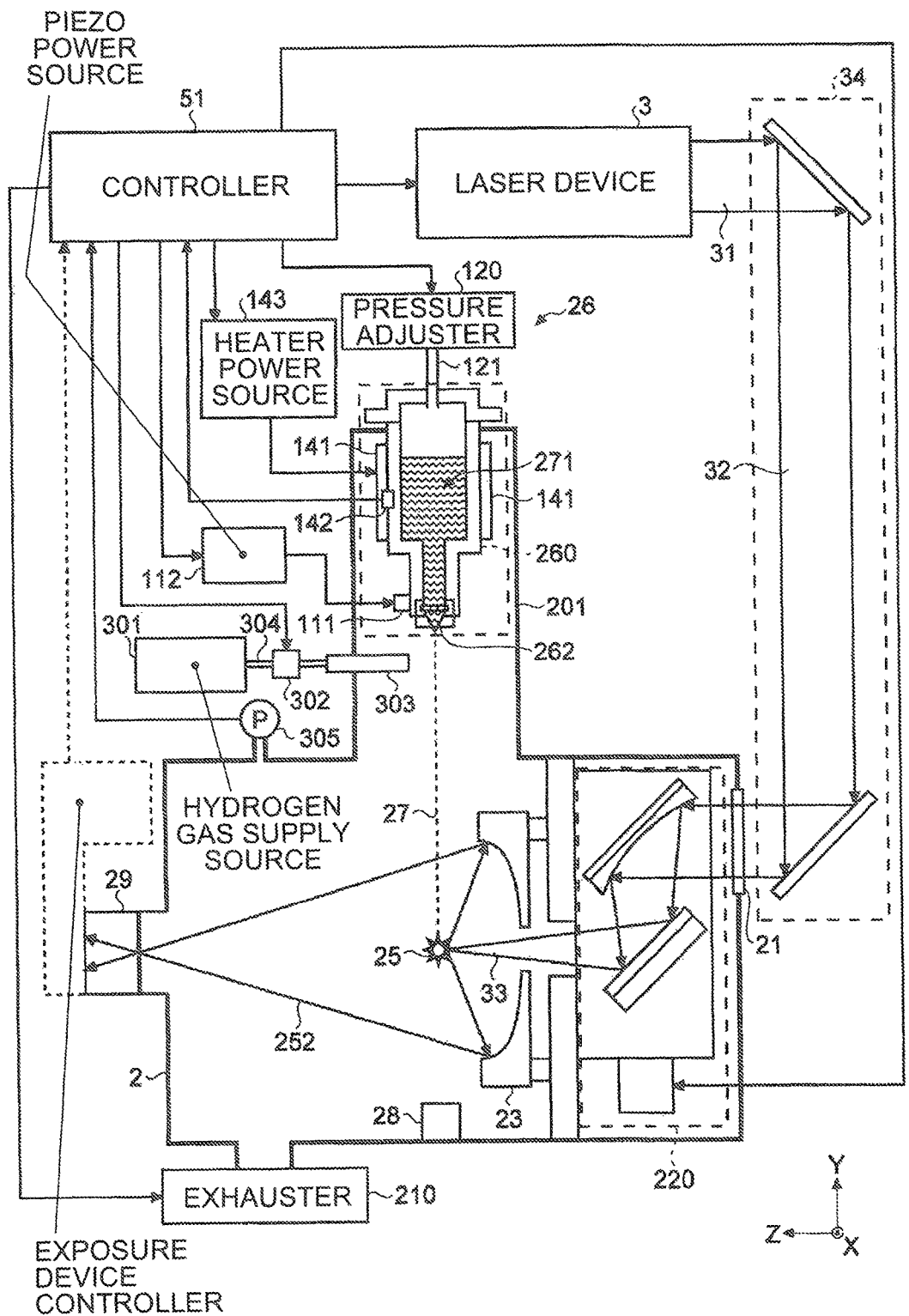
FIG. 7 is a schematic diagram illustrating an example of a schematic configuration of an EUV light generation device provided with a target generation device according to a first embodiment.

FIG. 7 is a schematic diagram illustrating an example of a schematic configuration of an EUV light generation device provided with a target generation device according to the first embodiment. As illustrated in FIG. 7, the target generation device of the first embodiment may include a hydrogen gas supply source 301, a flow rate adjuster 302, a gas nozzle 303, and a gas pipe 304, in addition to the target supply unit 26 illustrated in FIG. 2. The EUV light generation device of the first embodiment may further include a pressure sensor 305.

The hydrogen gas supply source 301 may be connected with the gas nozzle 303 via the gas pipe 304. The hydrogen gas supply source 301 may supply balance gas having the hydrogen gas concentration of about 3% to the gas pipe 304, for example. The balance gas may contain nitrogen ($N_2$) gas or argon (Ar) gas. In the below description, the balance gas is referred to as hydrogen gas.

The gas nozzle 303 may be provided to the sub chamber 201 in such a manner that jetted hydrogen gas flows near the nozzle section 262 of the target supply unit 26. The gas pipe 304 between the hydrogen gas supply source 301 and the gas nozzle 303 may be provided with the flow rate adjuster 302.

As the pressure sensor 305, a cold cathode ionization vacuum gauge, a Pirani vacuum gauge, a capacitance manometer, or the like may be used. Further, the exhauster 210 may be used as a remover for removing the moisture in the chamber 2.

The pressure sensor 305 and the flow rate adjuster 302 may be connected with the controller 51. The other part of the configuration may be the same as the configuration of the EUV light generation device illustrated in FIG. 2.

4.2 Operation

Next, an exemplary operation of the EUV light generation device illustrated in FIG. 7 will be described with reference to the flowchart of FIGS. 8A and 8B and the timing chart of FIG. 9.

Figure 8A:
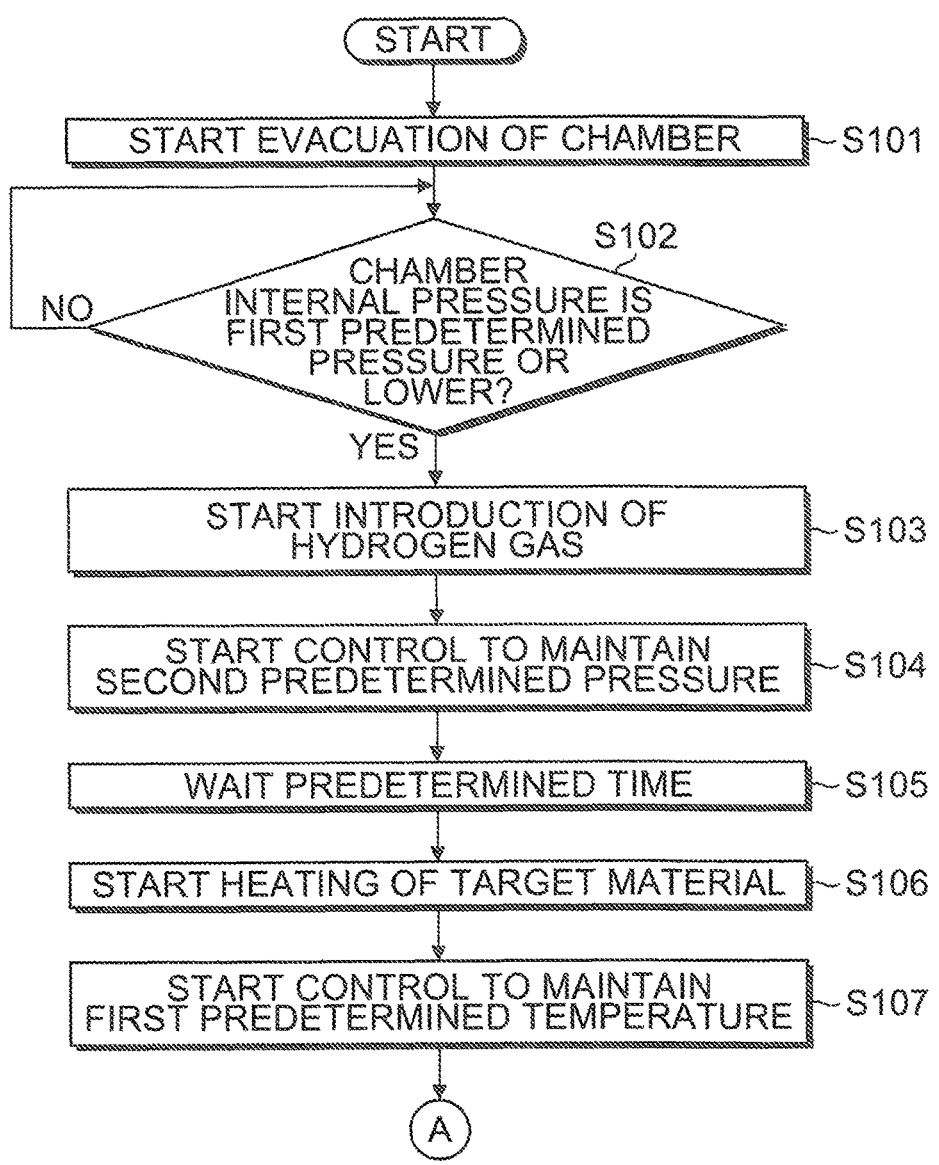
FIGS. 8A and 8B are flowcharts illustrating an exemplary operation of the EUV light generation device illustrated in FIG. 7.

After the target generation device is assembled into the chamber 2, as illustrated in step S101 of FIG. 8A, the controller 51 may operate the exhauster 210 to start exhaust of the atmospheric air in the chamber 2 (timing t1 of FIG. 9). At that time, in order to reduce the residue of the moisture and the oxygen, the controller 51 may repeat purging and evacuation of the chamber 2. As the purging gas, nitrogen gas or argon gas may be used.

As a result of exhausting performed by the exhauster 210, when the chamber internal pressure becomes a first predetermined pressure or lower (step S102 of FIG. 8A; YES), the controller 51 may start introduction of hydrogen gas from the hydrogen gas supply source 301 into the chamber 2 (timing t2 of FIG. 9), as illustrated in step S103 of FIG. 8A.

The first predetermined pressure may be 1 Pa or lower, for example. Further, the hydrogen gas may be introduced into the chamber 2 at a low flow rate.

Then, as illustrated in step S104 of FIG. 8A, the controller 51 may control the flow rate adjuster 302 in such a manner that the value of the pressure sensor 305 is maintained at a second predetermined pressure. The second predetermined pressure may be 100 Pa or lower, for example. Then, as illustrated in step S105 of FIG. 8A, the controller 51 may wait until a predetermined time elapses from the start of introduction of the hydrogen gas. The predetermined time may be 10 minutes or longer, for example.

Then, as illustrated in step S106 of FIG. 8A, the controller 51 may operate the heater 141 via the heater power source 143 in such a manner that the target material 271 in the tank 260 is heated to a first predetermined temperature that is equal to or higher than the melting point (timing t3 of FIG. 9). In the case where the target material 271 is tin, the melting point may be 232° C., and the first predetermined temperature may be in a range from 250° C. to 290° C., for example.

When the temperature of the target material 271 reaches the first predetermined temperature (timing t4 of FIG. 9), as illustrated in step S107 of FIG. 8A, the controller 51 may maintain the temperature of the target material 271 at the first predetermined temperature by controlling the heater power source 143 while monitoring the temperature of the target material 271 by the temperature sensor 142.

Figure 8B:
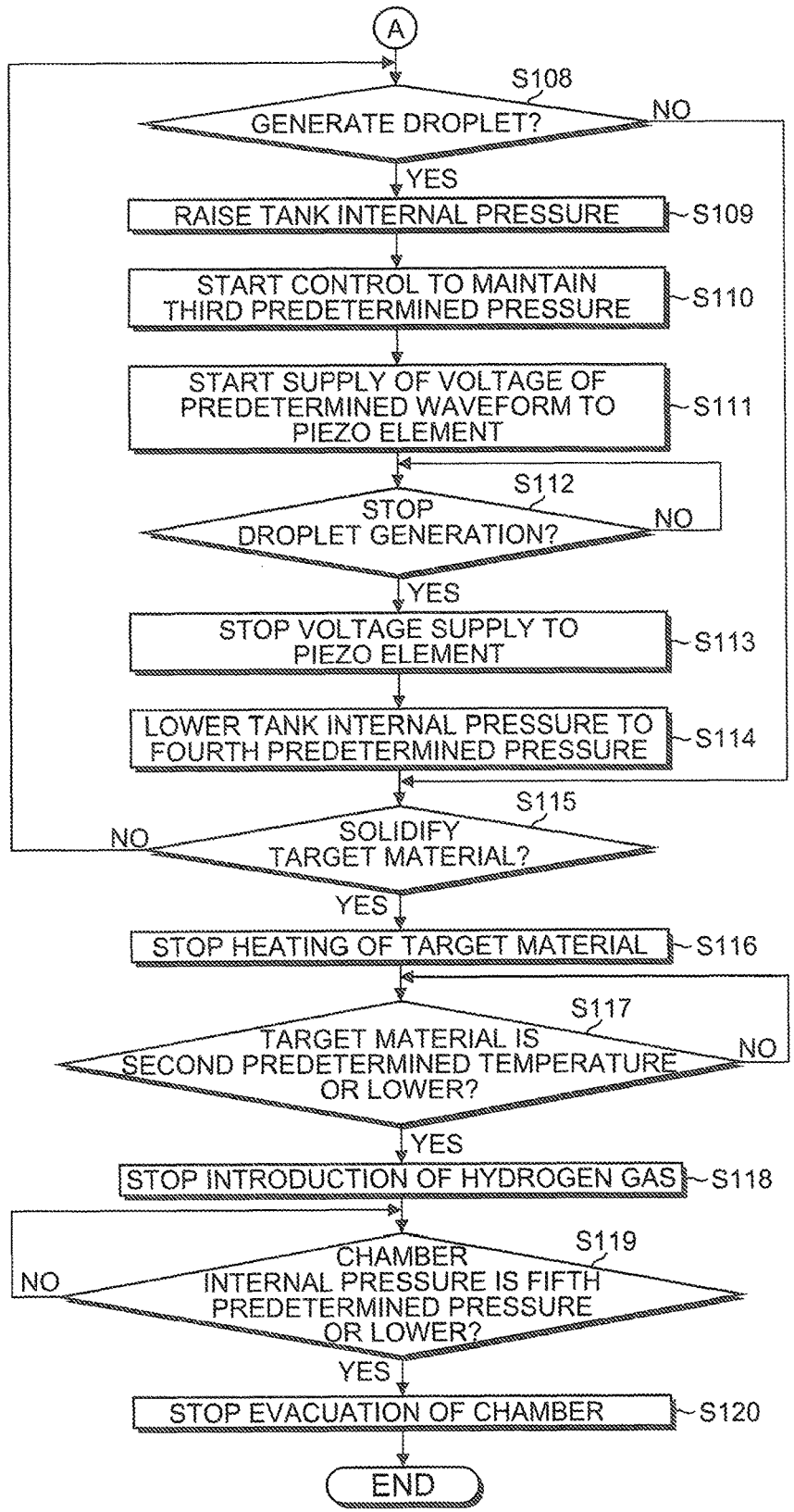

Then, as illustrated in step S108 of FIG. 8B, the controller 51 may determine whether or not to start generation of a droplet. When not starting generation of a droplet (step S108 of FIG. 8B; NO), the controller 51 may proceed to step S115 of FIG. 8B. It should be noted that start of generation of a droplet may be determined based on a request from the outside or based on other conditions.

When starting generation of a droplet (step S108 of FIG. 8B; YES), as illustrated in step 5109 of FIG. 8B, the controller 51 may control the pressure adjuster 120 in such a manner that the tank internal pressure becomes a third predetermined pressure. The third predetermined pressure may be 3 MPa or higher, for example. Thereby, the target material 271 may be jetted from the nozzle section 262. Further, as illustrated in step 5110 of FIG. 8B, the controller 51 may control the pressure adjuster 120 such that the tank internal pressure is maintained at the third predetermined pressure.

Then, as illustrated in step S111 of FIG. 8B, the controller 51 may apply voltage of a predetermined waveform to the piezo element 111 via the piezo power source 112. Thereby, the target material 271 in a jet from, jetted from the nozzle section 262, may be changed to be in a droplet form (target 27).

Then, as illustrated in step S112 of FIG. 8B, the controller 51 may determine whether or not to stop generation of a droplet. In the case of stopping generation of a droplet (step S112 of FIG. 8B; YES), the controller 51 may stop applying voltage to the piezo element 111 (step S113 of FIG. 8B) and reduce the tank internal pressure to a fourth predetermined pressure (step S114 of FIG. 8B). The fourth predetermined pressure may be 0.1 MPa or lower, for example.

Then, as illustrated in step S115 of FIG. 8B, the controller 51 may determine whether or not to solidify the target material 271. In the case of not solidifying the target material 271 (step S115 of FIG. 8B; NO), the controller 51 may return to step S108 of FIG. 8B. It should be noted that solidification of the target material 271 may be determined based on a request from the outside or based on other conditions.

In the case of solidifying the target material 271 (step S115 of FIG. 8B; YES), as illustrated in step S116 of FIG. 8B, the controller 51 may control the heater power source 143 to stop the heater 141 (timing t5 of FIG. 9). Thereby, the temperature of the target material 271 may drop to the second predetermined temperature that is equal to or lower than the solidifying point. The second predetermined temperature may be 50° C. or lower, for example.

When the temperature of the target material 271 drops to the second predetermined temperature or lower (step S117 of FIG. 8B; YES), as illustrated in step S118 of FIG. 8B, the controller 51 may stop introduction of the hydrogen gas from the hydrogen gas supply source 301 (timing t6 of FIG. 9). Thereby, the chamber internal pressure may start dropping.

Then, when the chamber internal pressure drops to a fifth predetermined pressure or lower (step S119 of FIG. 8B; YES), as illustrated in step S120 of FIG. 8B, the controller 51 may stop the exhauster 210 (timing t7 of FIG. 9). The fifth predetermined pressure may be 1 Pa or lower, for example.

4.3 Effect

In the case of introducing hydrogen gas into the chamber 2 as in the first embodiment described above, a reaction represented by the reaction formula (2) described below may be caused in the chamber 2. As a result, the oxygen partial pressure in the chamber 2 may drop.

$$H_2 + \tfrac{1}{2} O_2 = H_2O \tag{2}$$

Figure 10:
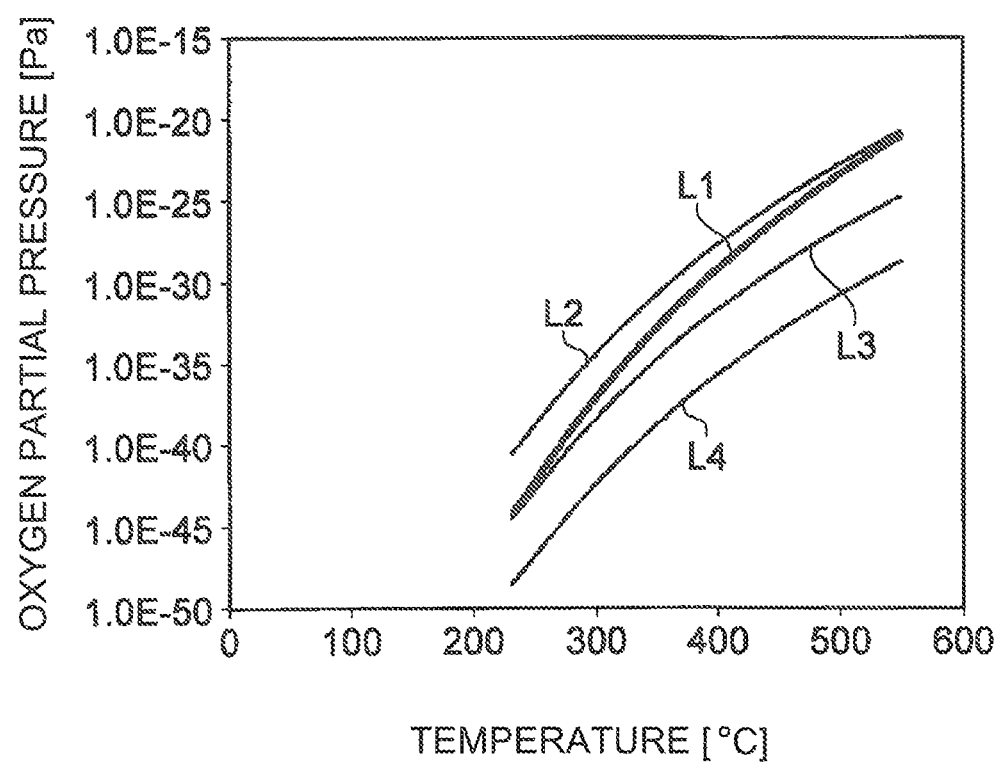
FIG. 10 is a graph illustrating a relationship between equilibrium oxygen partial pressure and temperature in a reaction illustrated in a reaction formula (2)

The equilibrium oxygen partial pressure of the reaction represented by the reaction formula (2) may depend on the ratio of moisture partial pressure ($P_{H2O}$) to hydrogen partial pressure ($P_{H2}$). FIG. 10 illustrates a relationship between the equilibrium oxygen partial pressure and the temperature. In FIG. 10, L1 represents the oxygen saturation partial pressure of tin when tin is used as the target material 271, L2 represents the oxygen partial pressure when the ratio α of the moisture partial pressure ($P_{H2O}$) to the hydrogen partial pressure ($P_{H2}$) ($=P_{H2O}/P_{H2}$) after the introduction of hydrogen gas is 1, L3 represents the oxygen partial pressure when the ratio α after the introduction of hydrogen gas is 0.01, and L4 represents the oxygen partial pressure when the ratio α after the introduction of hydrogen gas is 0.0001.

As illustrated in FIG. 10, when the temperature of the tin that is the target material 271 is in a temperature range from 250° C. to 290° C., in order to make the oxygen partial pressure in the chamber 2 equal to or lower than the oxygen saturation partial pressure of the tin, it is only necessary that the ratio α of the moisture partial pressure to the hydrogen partial pressure is 0.01 or lower. In order to make the ratio α equal to or lower than 0.01, it is necessary to remove the moisture generated in the reaction formula (2), in addition to introduction of the hydrogen gas.

As such, in the first embodiment, an increase of the moisture partial pressure in the chamber 2 may be suppressed by introducing the hydrogen gas into the chamber 2 to thereby maintain the hydrogen partial pressure at constant and exhausting the moisture generated in the reaction formula (2) by the exhauster 210 (moisture remover). By maintaining the ratio α of the hydrogen partial pressure to the moisture partial pressure ($=P_{H2O}/P_{H2}$) at 0.01 or lower, the oxygen partial pressure in the chamber 2 can be maintained at the oxygen saturation partial pressure or lower of the tin that is the target material 271. As a result, oxidization of the target material 271 in contact with the atmosphere in the chamber 2 can be suppressed.

5. Second Embodiment

Next, a target generation device, a chamber device, a target generation method, and an EUV light generation device, according to a second embodiment, will be described in detail with reference to the drawings. In the below description, constituent elements that are the same as the constituent elements described above are denoted by the same reference numerals, and the overlapping description is omitted.

5.1 Configuration

Figure 11:
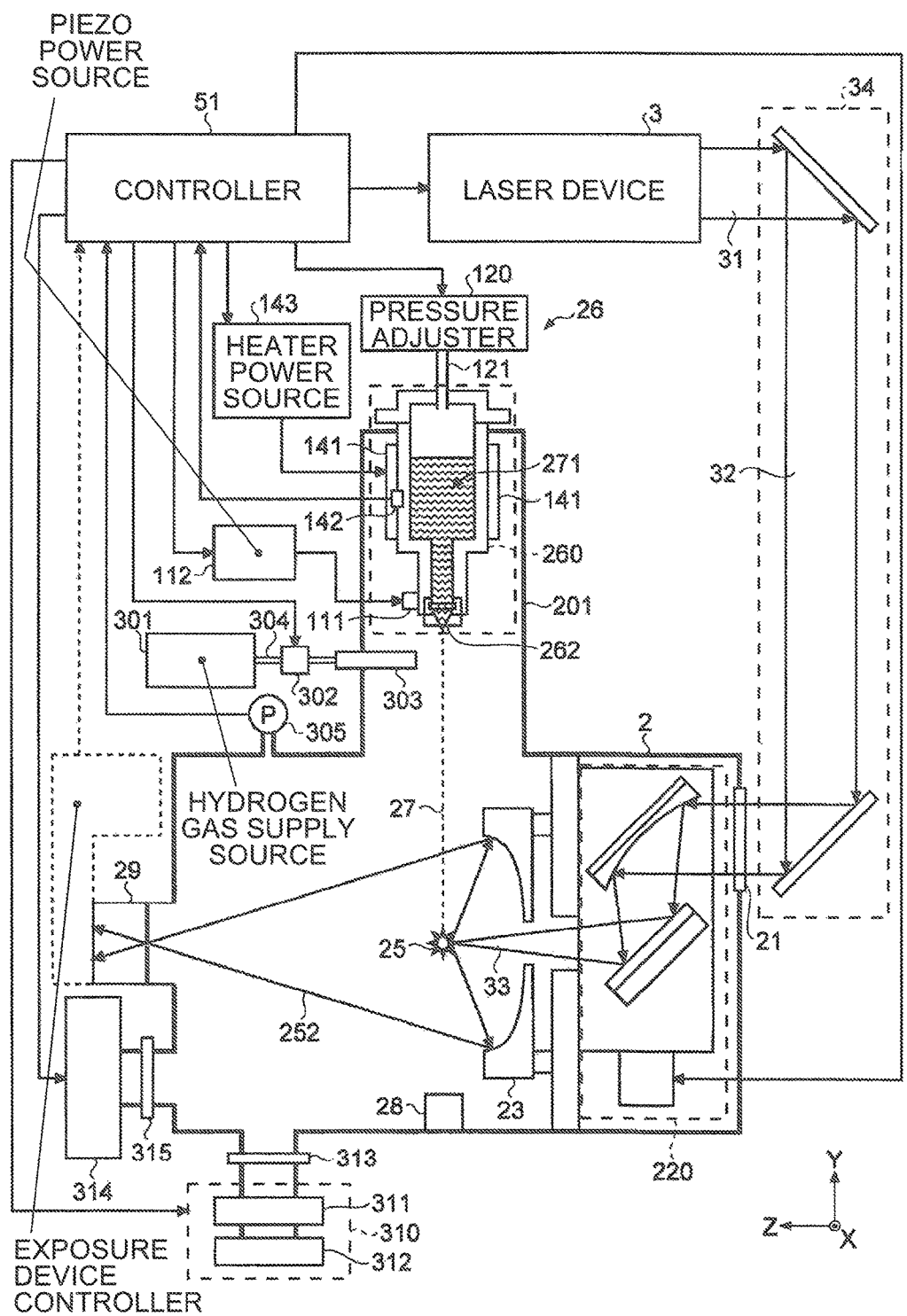
FIG. 11 is a schematic diagram illustrating an example of a schematic configuration of an EUV light generation device provided with a target generation device according to a second embodiment.

FIG. 11 is a schematic diagram illustrating an example of a schematic configuration of an EUV light generation device provided with a target generation device according to the second embodiment. As illustrated in FIG. 11, in the EUV light generation device of the second embodiment, the exhauster 210 may be replaced with a first exhauster 310 for high evacuation in the same configuration as that of the EUV light generation device illustrated in FIG. 7. The EUV light generation device of the second embodiment may also be provided with a second exhauster 314 for low evacuation.

The second exhauster 314 may be a dry vacuum pump of roots type, scroll type, or the like. The second exhauster 314 may be separable from the space in the chamber 2 by a gate valve 315.

The first exhauster 310 may include a high evacuation pump 311 and a low evacuation pump 312. The low evacuation pump 312 may be a dry vacuum pump of roots type, scroll type, or the like. The high evacuation pump 311 may be a turbo molecular pump. In the case where the low evacuation pump 312 can be operated alone, the second exhauster 314 may be omitted, and the low evacuation pump 312 may be used instead of the second exhauster 314. The first exhauster 310 may be separable from the space in the chamber 2 by a gate valve 313.

The other part of the configuration may be the same as that of the EUV light generation device illustrated in FIG. 7.

5.2 Operation

Next, an exemplary operation of the EUV light generation device illustrated in FIG. 11 will be described with reference to the flowchart of FIGS. 12A and 12B and the timing chart of FIG. 13. In the below description, constituent elements that are the same as the constituent elements described above are denoted by the same reference numerals, and the overlapping description is omitted.

Figure 12A:
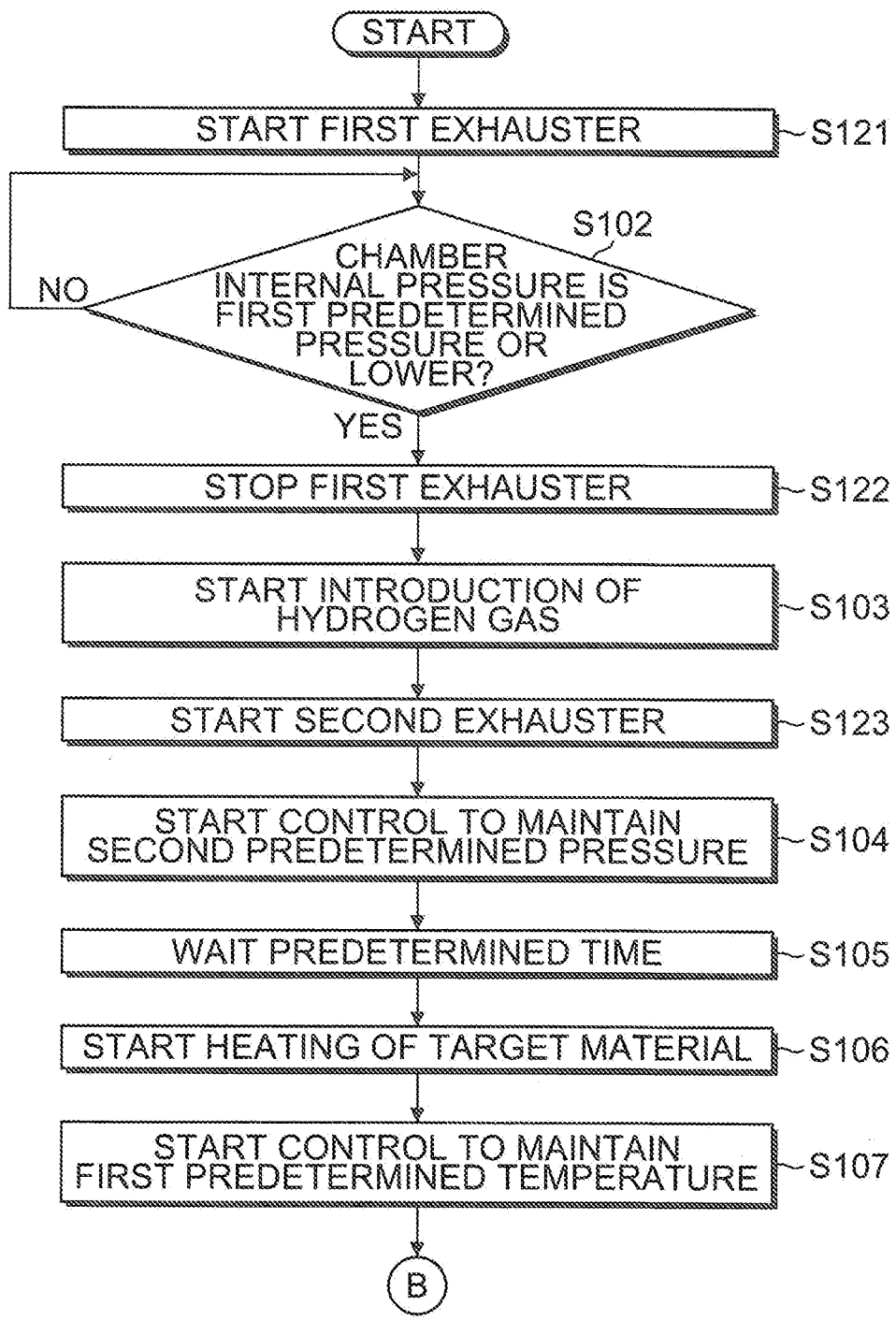
FIGS. 12A and 12B are flowcharts illustrating an exemplary operation of the EUV light generation device illustrated in FIG. 11.
Figure 12B:
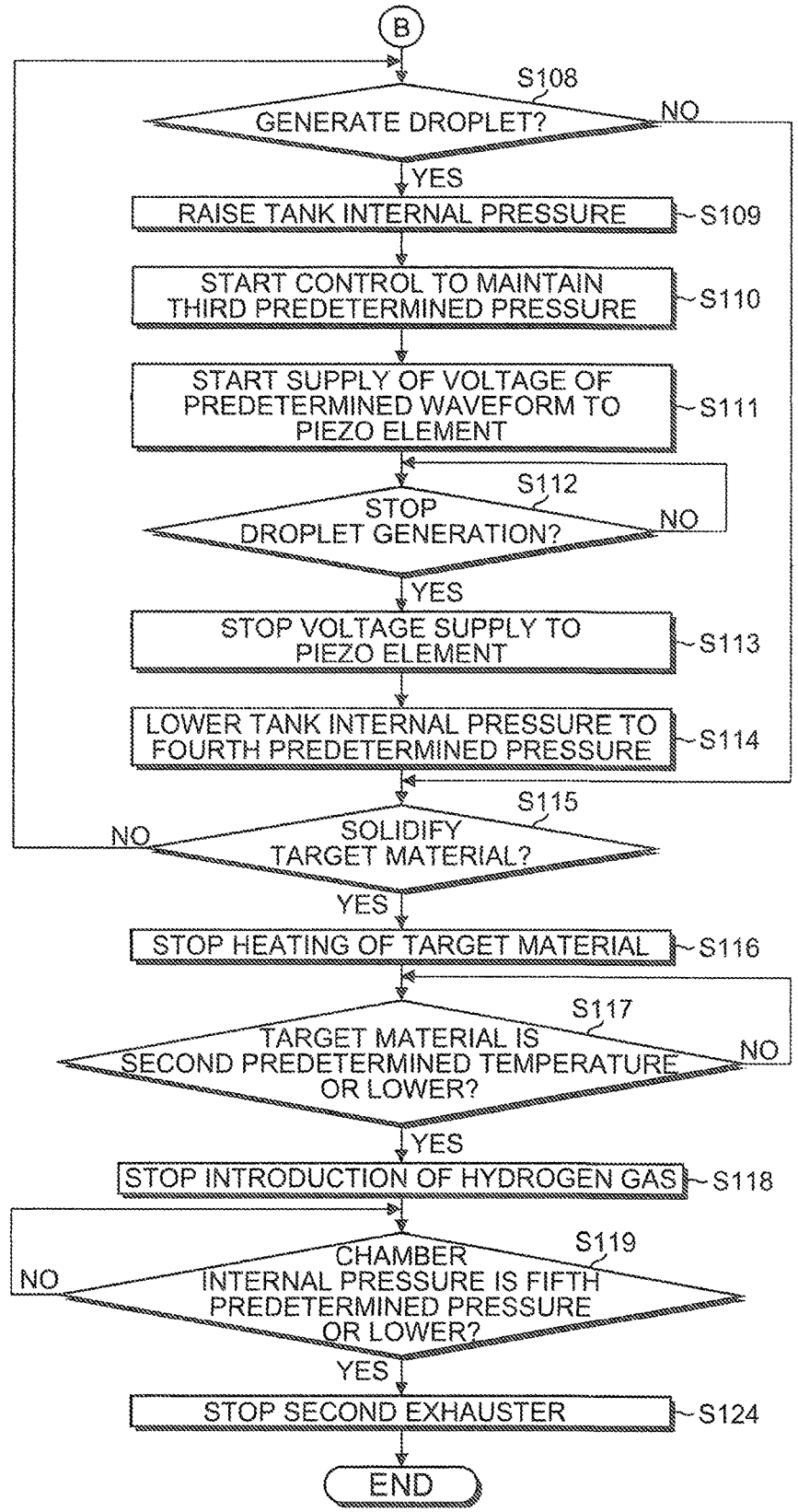

As illustrated in FIGS. 12A and 12B, in the exemplary operation of the EUV light generation device illustrated in FIG. 11, an operation that is the same as the operation illustrated in FIGS. 8A and 8B may be performed. However, the operation illustrated in step S101 of FIG. 8A may be replaced with the operation of starting the first exhauster 310 to start high-speed exhausting of the atmospheric air in the chamber 2 (step S121 of FIG. 12A; timing t1 of FIG. 13). Further, it is also possible to add an operation of stopping the first exhauster 310 (step S122 of FIG. 12A) between steps S102 and S103 of FIG. 8A, and add an operation of starting the second exhauster 314 to start low evacuation of the atmospheric air in the chamber 2 (step S123 of FIG. 12A) between steps S103 and S104 of FIG. 8A. Further, the operation illustrated in step S120 of FIG. 8B may be replaced with an operation of stopping the second exhauster 314 (step S124 of FIG. 12B; timing t7 of FIG. 13). It should be noted that the gate valve 313 may be opened and closed at the time of starting and stopping the first exhauster 310.

Similarly, the gate valve 315 may be opened and closed at the time of starting and stopping the second exhauster 314.

The other part of the operation may be the same as the exemplary operation illustrated in FIGS. 8A, 8B, and 9.

5.3 Effect

As described above, in the second embodiment, gas containing moisture is exhausted by the second exhauster 314 for low evacuation. Accordingly, the chamber internal pressure can be higher than that of the case of exhausting the gas by the first exhauster 310 for high evacuation. Thereby, the hydrogen content in the chamber 2 can be more than enough amount for the hydrogen content consumed in the reaction formula (2). This means that as a drop of the hydrogen partial pressure can be suppressed, the ratio α of the moisture partial pressure to the hydrogen partial pressure can be easily maintained at 0.01 or lower. Consequently, the oxygen partial pressure in the chamber 2 can be maintained at the oxygen saturation partial pressure or lower of the target material 271. It should be noted that when the chamber internal pressure increases, the exhaust flow rate by the exhauster increases, whereby the velocity of removing the moisture generated according to the reaction formula (2) can increase.

Further, in the second embodiment, as high evacuation is performed after the target generation device is assembled into the chamber 2, the moisture adhering to the inside of the chamber 2 by the open atmospheric system can be reduced up to the partial pressure of high vacuum region.

The other effects may be the same as those of the embodiment described above.

6. Third Embodiment

Next, a target generation device, a chamber device, a target generation method, and an EUV light generation device, according to a third embodiment, will be described in detail with reference to the drawings. In the below description, constituent elements that are the same as the constituent elements described above are denoted by the same reference numerals and the overlapping description is omitted.

6.1 Configuration

Figure 14:
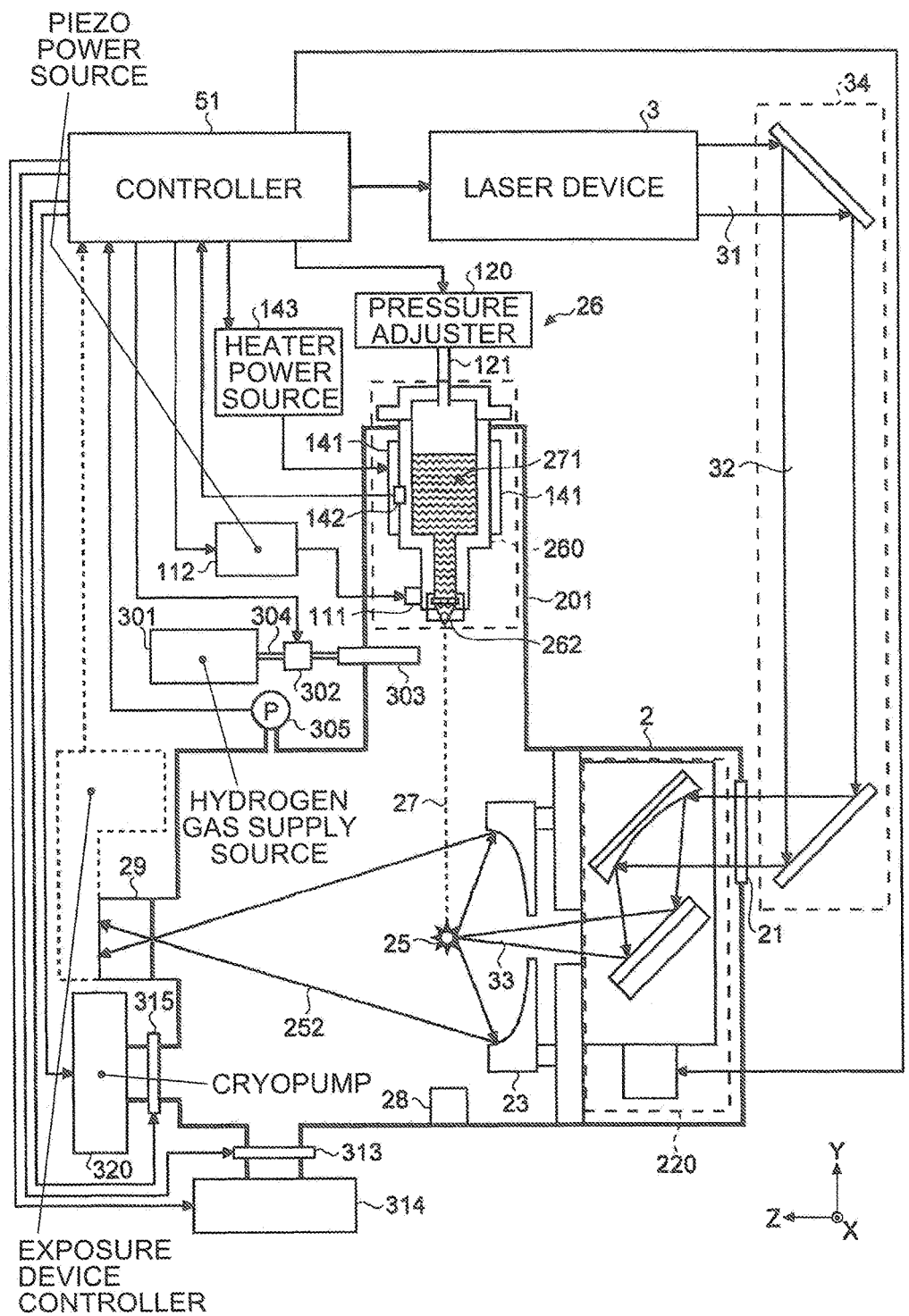
FIG. 14 is a schematic diagram illustrating an example of a schematic configuration of an EUV light generation device provided with a target generation device according to a third embodiment.

FIG. 14 is a schematic diagram illustrating an example of a schematic configuration of the EUV light generation device provided with the target generation device according to the third embodiment. As illustrated in FIG. 14, in the EUV light generation device of the third embodiment, the second exhauster 314 may be disposed instead of the first exhauster 310 and a cryopump 320 may be disposed instead of the second exhauster 314, in the same configuration as that of the EUV light generation device illustrated in FIG. 11.

The other part of the configuration may be the same as that of the EUV light generation device illustrated in FIG. 11.

6.2 Operation

Figure 13:
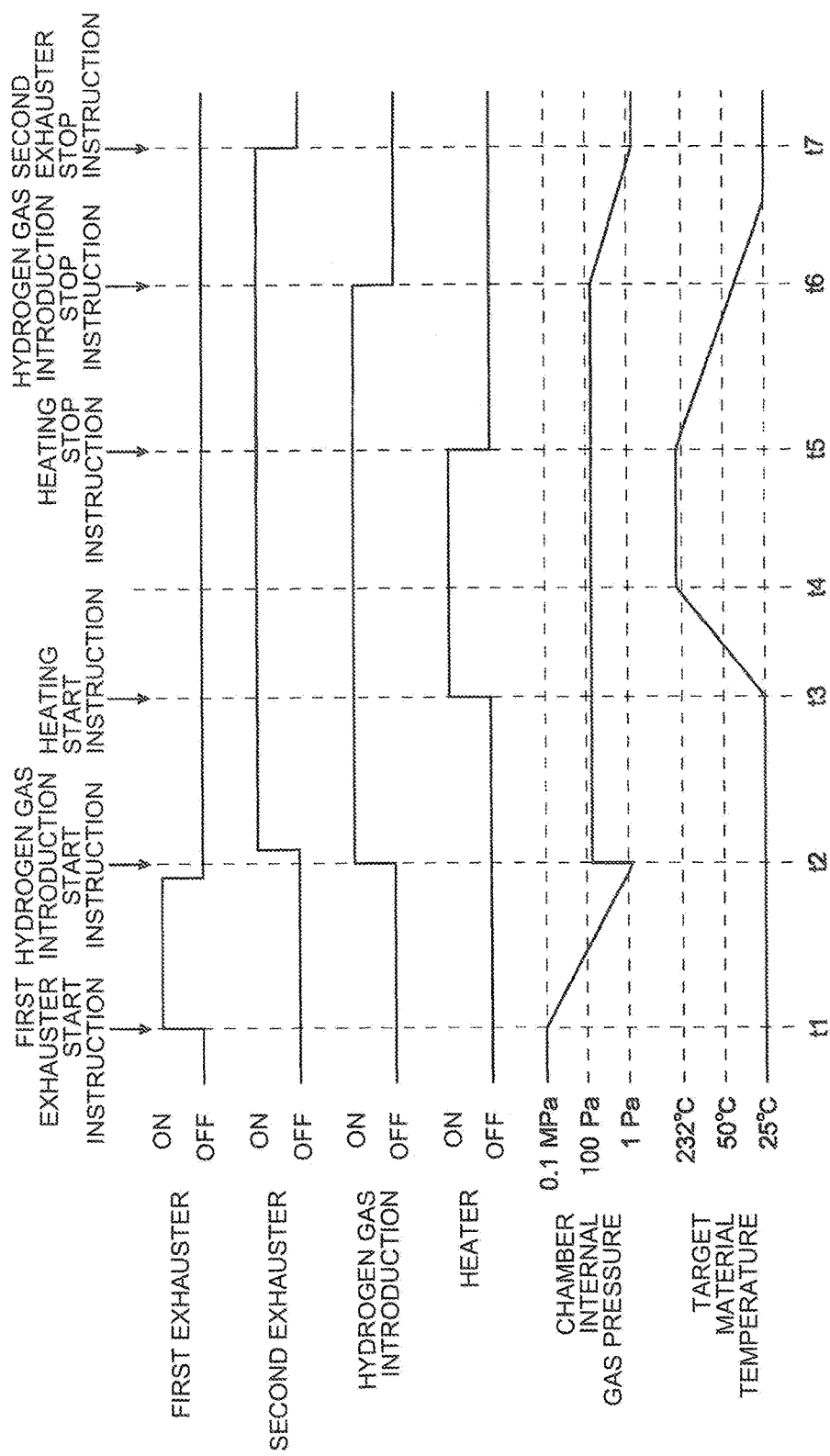
FIG. 13 is a timing chart illustrating an exemplary operation of the EUV light generation device illustrated in FIG. 11.

An exemplary operation of the EUV light generation device illustrated in FIG. 14 may be an exemplary operation in which the first exhauster 310 and the second exhauster 314 in the exemplary operation described with use of FIGS. 12A, 12B, and 13 in the second embodiment are replaced with the second exhauster 314 and the cryopump 320, respectively.

However, the operation of the third embodiment is not limited to the exemplary operation described above. For example, at the time of generating a droplet or the like, evacuation may be performed by the second exhauster 314 while introducing the hydrogen gas into the chamber 2 at a constant flow rate. Meanwhile, when the temperature of the target material 271 rises, when the target material 271 is allowed to melt but a droplet is not generated, when the temperature of the target material 271 drops, and the like, the chamber 2 may be evacuated by the cryopump 320 after the hydrogen gas is introduced into the chamber 2 at a predetermined pressure and the chamber 2 is sealed.

The other part of the operation may be the same as the exemplary operation illustrated in FIGS. 12A, 12B, and 13.

6.3 Effect

Figure 15:
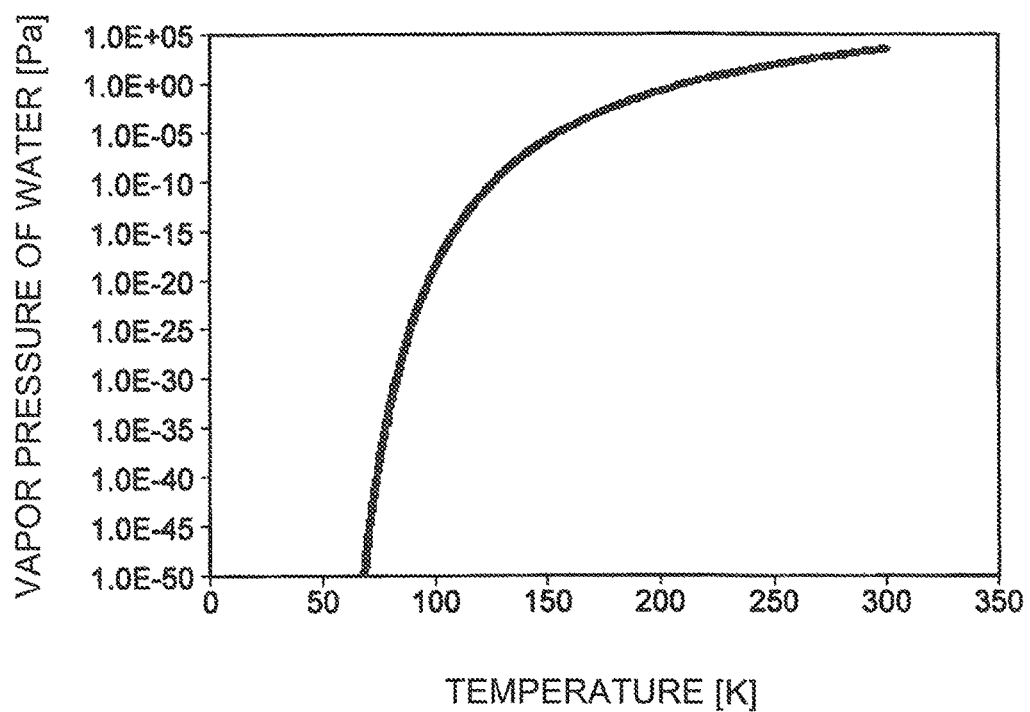
FIG. 15 is a graph illustrating temperature dependency of vapor pressure of water.

As described above, in the third embodiment, as the cryopump 320 (moisture remover) is used, moisture exhaust efficiency can be improved. FIG. 15 illustrates temperature dependency of the vapor pressure of the water. The cryogenic surface of the cryopump 320 may be 15 K or lower. Accordingly, by using the cryopump 320, the moisture partial pressure may drop to $1 \times 10^{-50}$ Pa or lower, as illustrated in FIG. 15. Thereby, the ratio α of the moisture partial pressure to the hydrogen partial pressure can be reduced. As a result, the oxygen partial pressure in the chamber 2 can be further lowered with respect to the oxygen saturation partial pressure of the target material 271.

Further, in the third embodiment, as the cryopump 320 can be operated in a state where the hydrogen gas is introduced into the chamber 2 and the chamber 2 is sealed, the consumption amount of the hydrogen gas can be reduced.

The other effects may be the same as those of the embodiments described above.

6.4 Modification

Figure 16:
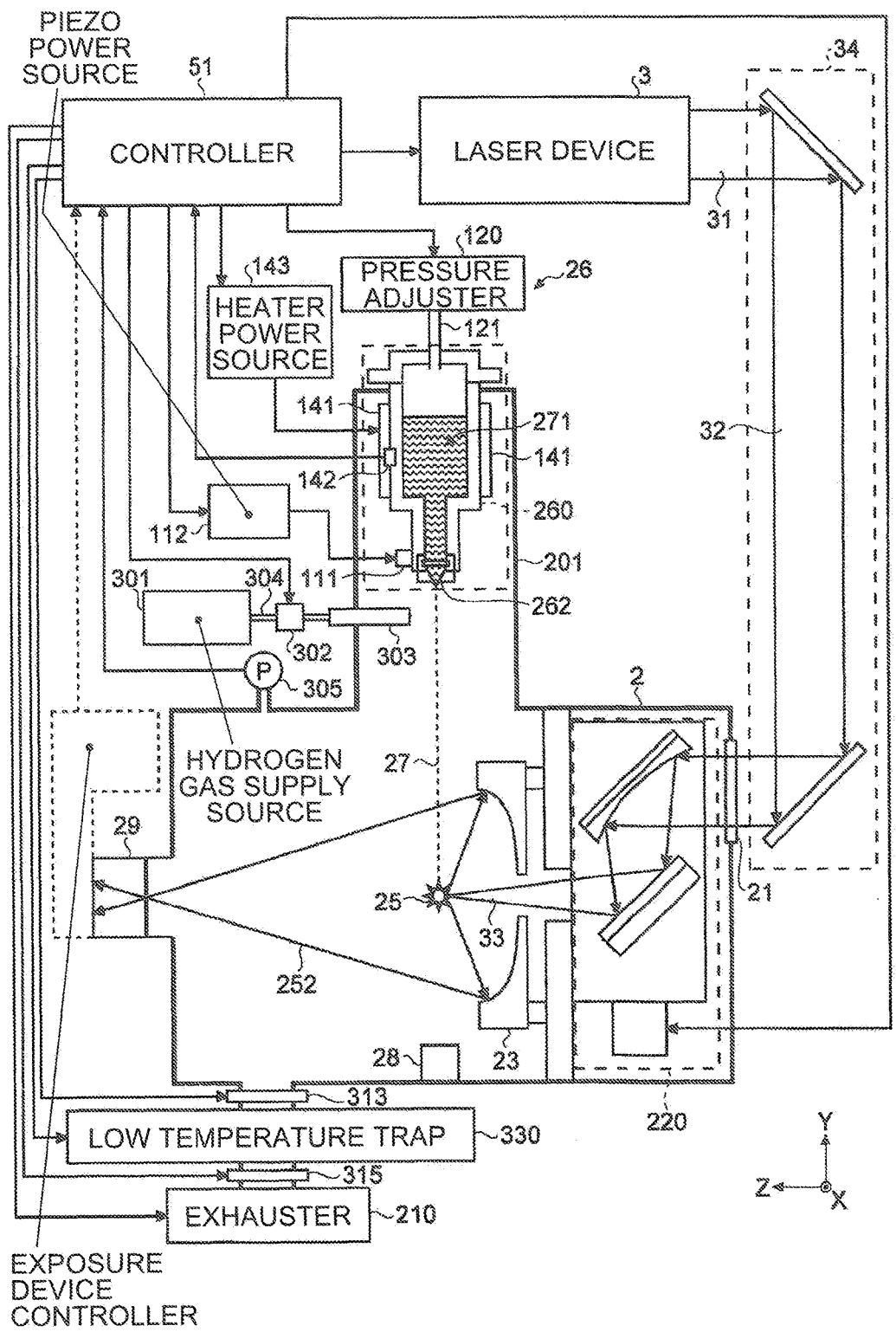
FIG. 16 is a schematic diagram illustrating an example of a schematic configuration of an EUV light generation device according to a modification of the third embodiment.

Here, a modification of the EUV light generation device according to the third embodiment will be described. FIG. 16 illustrates an example of a schematic configuration of an EUV light generation device of the modification. In the below description, constituent elements that are the same as the constituent elements described above are denoted by the same reference numerals, and the overlapping description is omitted.

As illustrated in FIG. 16, the EUV light generation device of the third embodiment may also include a low temperature trap 330, in addition to the same configuration as that of the EUV light generation device illustrated in FIG. 7. The low temperature trap 330 may be disposed on the space side (upstream side) in the chamber 2 from the exhauster 210. The low temperature trap 330 may be of a type in which cooling is performed using liquid nitrogen or using a refrigerator.

An exemplary operation of the EUV light generation device illustrated in FIG. 16 may be an exemplary operation in which the first exhauster 310 and the second exhauster 314 in the exemplary operation described with use of FIGS. 12A, 12B, and 13 in the second embodiment are replaced with the exhauster 210 and the low temperature trap 330, respectively. Meanwhile, stop of the first exhauster 310 (exhauster 210 in the third embodiment) at step S122 of FIG. 12A may be omitted, and stop of the second exhauster 314 at step S124 of FIG. 12B and at the timing t7 of FIG. 13 may be replaced with stop of the exhauster 210 and the low temperature trap 330. Moreover, regarding the operation of the gate valves 313 and 315, the gate valve 313 may be opened and the gate valve 315 may be opened after the exhauster 210 is started, and the gate valve 313 may be closed before the low temperature trap 330 stops.

The other part of the configuration, operation, and effects may be the same as those of the embodiments described above.

7. Fourth Embodiment

Next, another embodiment of a target generation device including the target supply unit 26 of the embodiments described above will be described below in detail with reference to the drawings. In the below description, constituent elements that are the same as the constituent elements described above are denoted by the same reference numerals, and the overlapping description is omitted.

7.1 Configuration

Figure 17:
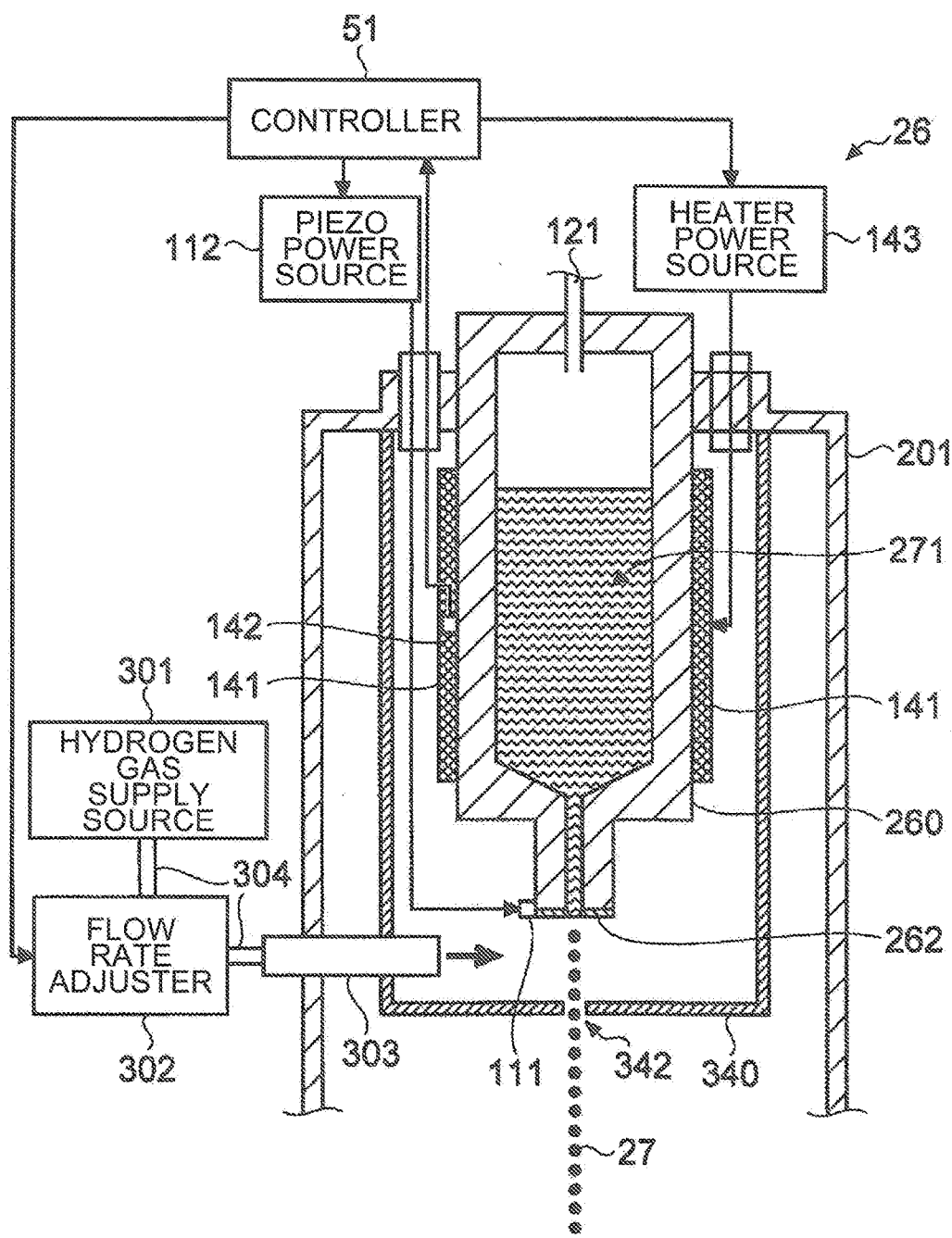
FIG. 17 is a schematic diagram illustrating an example of a schematic configuration of a target generation device according to a fourth embodiment.

FIG. 17 is a schematic diagram illustrating an example of a schematic configuration of a target generation device according to a fourth embodiment. As illustrated in FIG. 17, the target generation device of the fourth embodiment may include a cover member 340 in addition to the same configuration as that of the target generation device illustrated in FIG. 7, for example.

The cover member 340 may be disposed so as to surround at least the nozzle section 262 of the target supply unit 26. The cover member 340 may be fixed to the inner wall of the sub chamber 201 or to the outer wall of the tank 260.

An inlet port of the gas nozzle 303 for introducing hydrogen gas into the chamber 2 may be disposed in the space inside the cover member 340 surrounding the nozzle section 262.

In the cover member 340 in a fixed state, a hole 342 may be provided in a portion facing the nozzle hole of the nozzle section 262. A jet or a droplet (target 27) of the target material 271 jetted from the nozzle hole may pass through the hole 342 and reach the plasma generation region 25 in the chamber 2.

7.2 Effect

In the fourth embodiment, the inlet port of the gas nozzle 303 may be disposed inside the cover member 340 surrounding the nozzle section 262. Accordingly, hydrogen gas can be introduced effectively to the vicinity of the nozzle section 262. Thereby, an oxide of the target material 271 adhering to the vicinity of the nozzle hole of the nozzle section 262 can be reduced efficiently.

Further, the moisture generated according to the reaction formula (2) can flow from the hole 342 of the cover member 340 into the chamber 2 by the flow of the hydrogen gas. Accordingly, the moisture generated according to the reaction formula (2) can be exhausted efficiently by a moisture remover such as the exhauster 210. Thereby, the oxygen partial pressure near the nozzle section 262 can be reduced reliably.

Further, as the heater 141 is disposed in the cover member 340, the temperature of the hydrogen gas near the nozzle section 262 in the cover member 340 can rise. When the temperature of the hydrogen gas rises, the reaction rate of the reaction formula (2) can be faster. Consequently, the oxygen partial pressure near the nozzle section 262 can be reduced more efficiently.

The other effects may be the same as those of the embodiments described above.

8. Fifth Embodiment

Next, another exemplary configuration of the target generation device exemplarily illustrated in the fourth embodiment will be described below in detail as a fifth embodiment, with reference to the drawings. In the below description, constituent elements that are the same as the constituent elements described above are denoted by the same reference numerals, and the overlapping description is omitted.

8.1 Configuration

Figure 18:
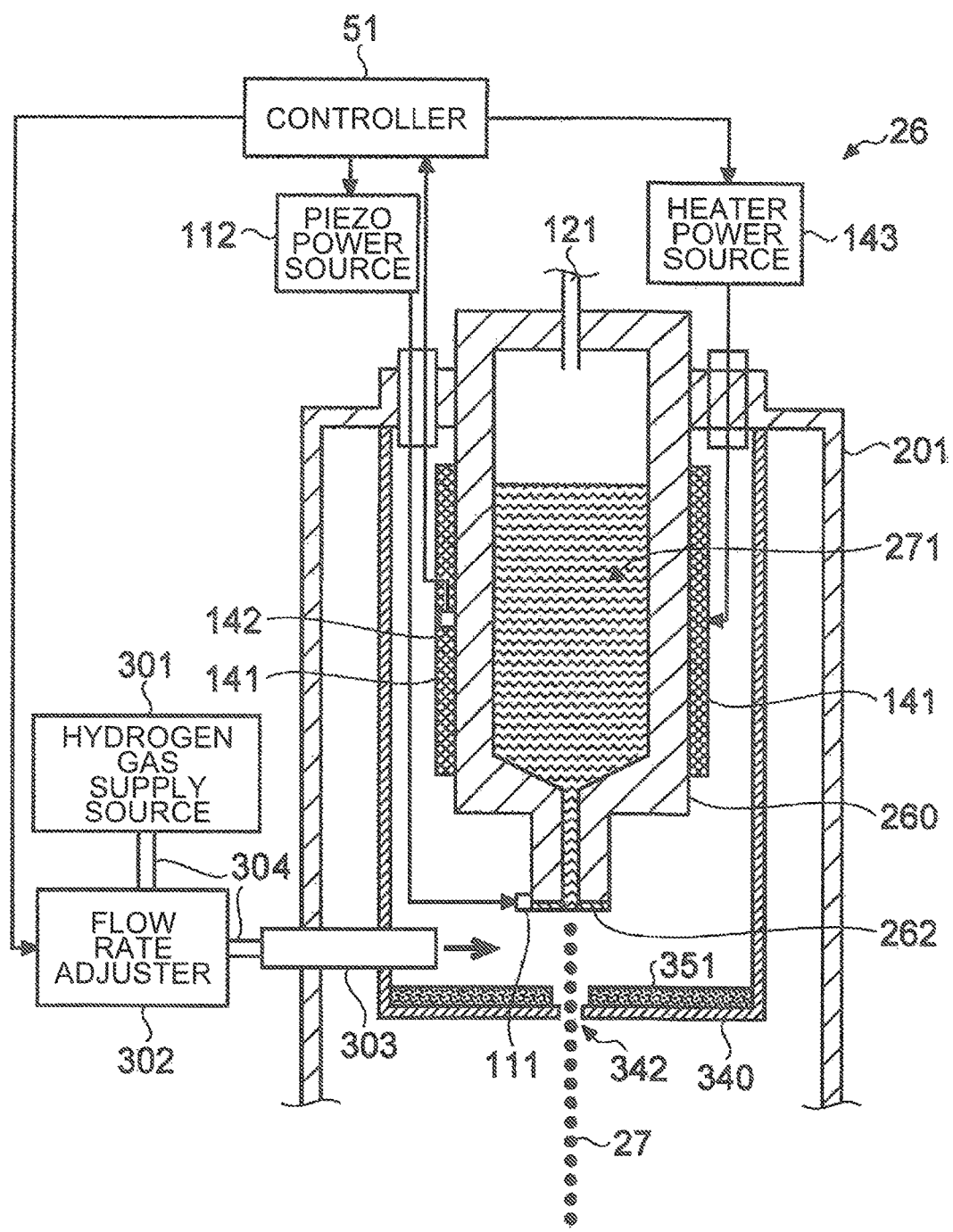
FIG. 18 is a schematic diagram illustrating an example of a schematic configuration of a target generation device according to a fifth embodiment.

FIG. 18 is a schematic diagram illustrating an example of a schematic configuration of the target generation device according to the fifth embodiment. As illustrated in FIG. 18, the target generation device of the fifth embodiment may include a catalyst 351 that promotes reaction between hydrogen and oxygen, in addition to the same configuration as that of the target generation device illustrated in FIG. 17, for example. The catalyst 351 may be disposed in the cover member 340. In that case, the catalyst 351 may be disposed near the nozzle section 262. The catalyst 351 may be platinum (Pt) or the like.

8.2 Effect

In the fifth embodiment, as the reaction rate of the reaction formula (2) is accelerated by the catalyst 351, the oxygen partial pressure near the nozzle section 262 can be reduced more efficiently. Further, the catalyst 351 may be heated by the radiation of the heater 141. Accordingly, the reaction rate of the reaction formula (2) can be further accelerated. Consequently, the oxygen partial pressure near the nozzle section 262 can be reduced more efficiently.

8.3 Modification

Figure 19:
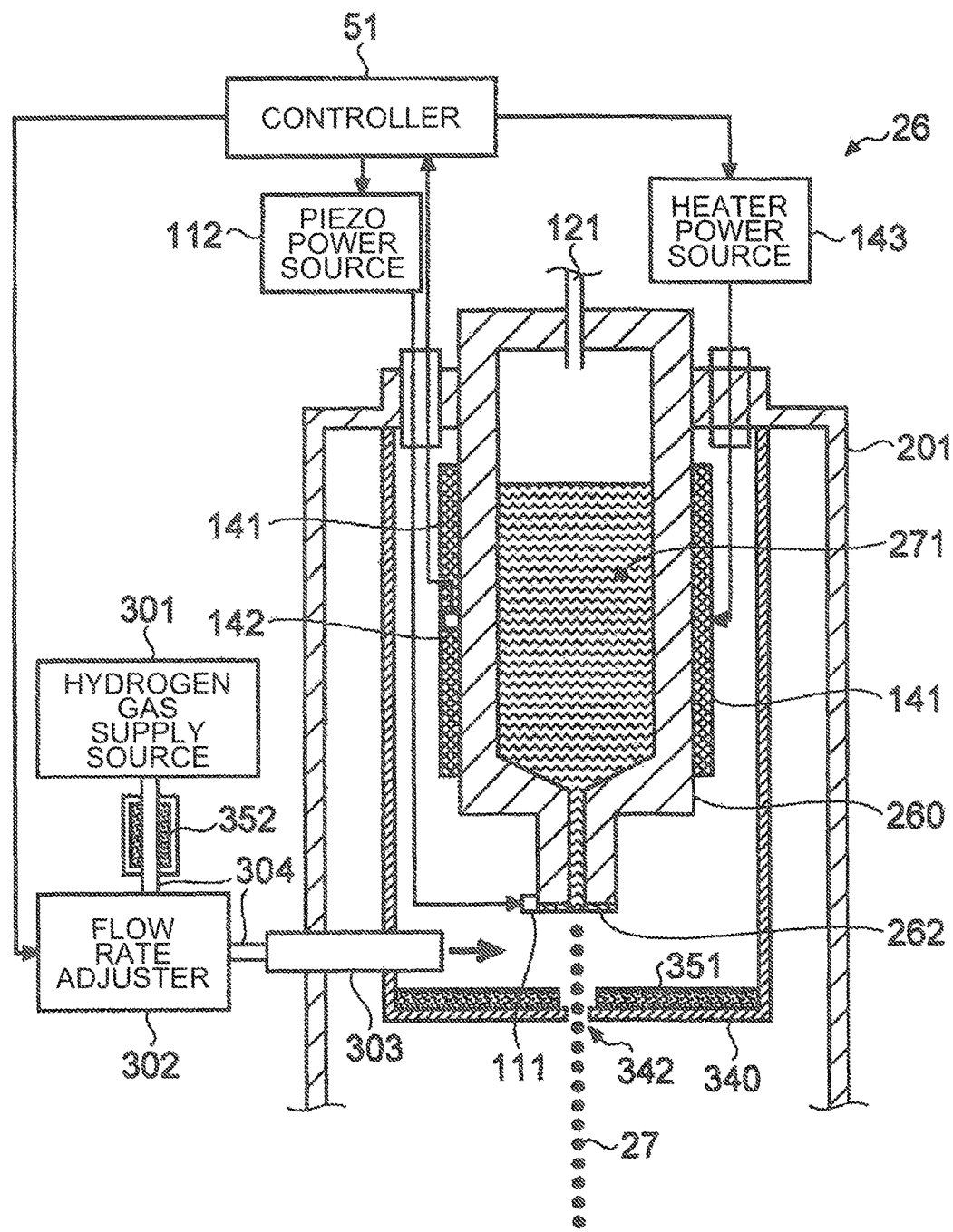
FIG. 19 is a schematic diagram illustrating a modification of the target generation device of the fifth embodiment.

FIG. 19 is a schematic diagram illustrating a modification of the target generation device according to the fifth embodiment. As illustrated in FIG. 19, a catalyst 352 that promotes the reaction rate of the reaction formula (2) may be disposed in the gas pipe 304 connecting the hydrogen gas supply source 301 and the gas nozzle 303. The catalyst 352 may be platinum (Pt) or the like, as with the catalyst 351.

In this way, by disposing the catalyst 352 in the gas pipe 304 connecting the hydrogen gas supply source 301 and the gas nozzle 303, it is possible to introduce hydrogen gas having lower oxygen partial pressure into the chamber 2. Consequently, the oxygen partial pressure near the nozzle section 262 can be reduced more efficiently.

The other part of the configuration and effects may be the same as those of the embodiments described above.

9. Sixth Embodiment

In the configuration of the fifth embodiment, a heat source may be used instead of the catalyst.

9.1 Configuration

Figure 20:
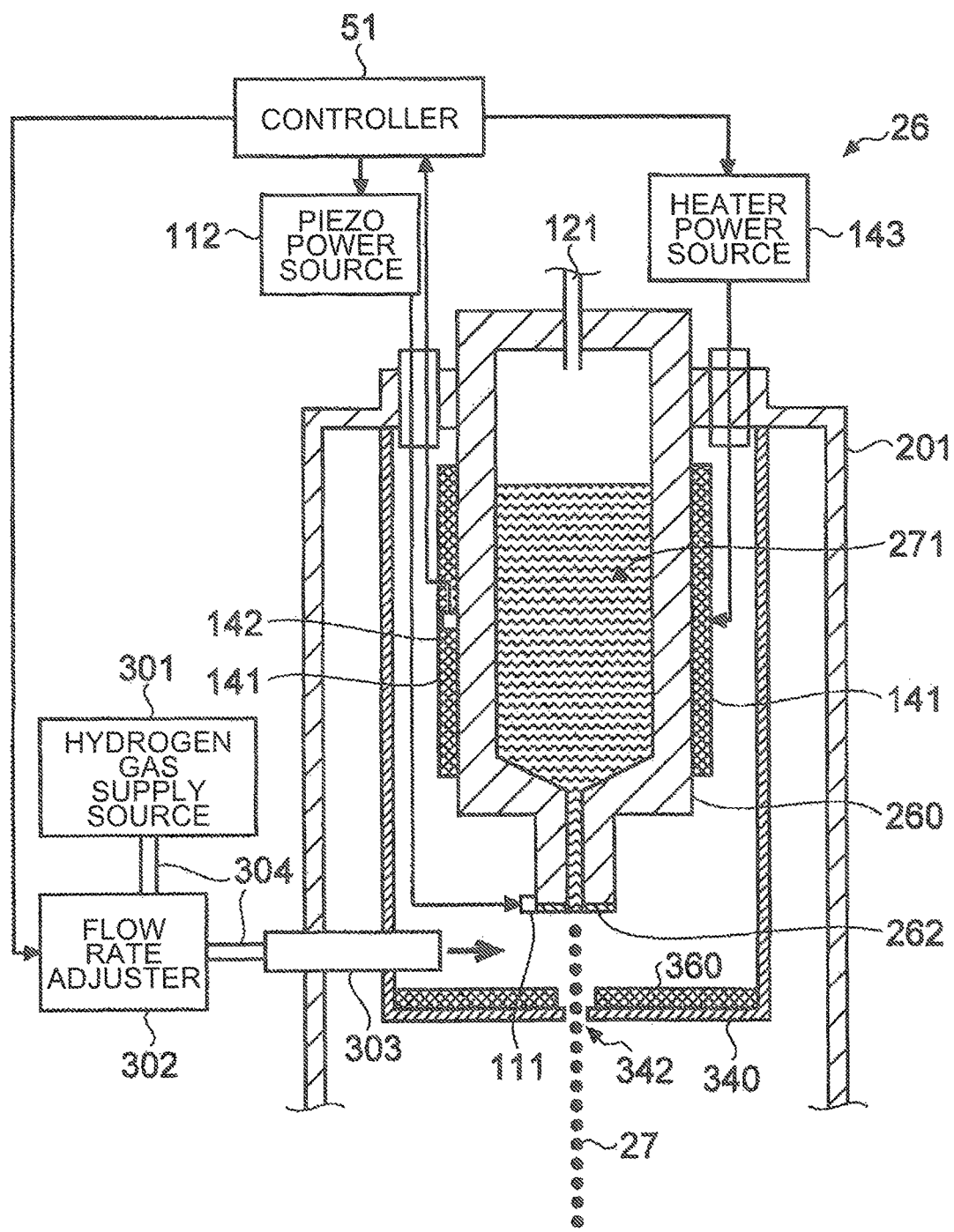
FIG. 20 is a schematic diagram illustrating an example of a schematic configuration of a target generation device according to a sixth embodiment.

FIG. 20 is a schematic diagram illustrating an example of a schematic configuration of a target generation device according to a sixth embodiment. As illustrated in FIG. 20, the target generation device of the sixth embodiment may be configured such that a heat source 360 may be disposed near the nozzle section 262, instead of the catalyst 351 illustrated in FIG. 18. The heat source 360 may be a conductor that generates Joule heat such as a ceramic heater. The conductor that generates Joule heat may be tungsten, molybdenum, platinum (Pt), or the like. The temperature of the heat source 360 may be a temperature equal to or higher than the melting point of the target material 271 (e.g., 250° C. to 290° C.), and preferably, 700° C. or higher.

9.2 Effect

In the sixth embodiment, as the heat source 360 is disposed near the nozzle section 262, the temperature of the hydrogen gas can rise due to the heat from the heat source 360. Accordingly, the reaction rate of the reaction formula (2) can be faster. Consequently, the oxygen partial pressure near the nozzle section 262 can be reduced more efficiently.

The other part of the configuration and effects may be the same as those of the embodiments described above. It should be noted that the heat source may be disposed in the gas pipe 304 connecting the hydrogen gas supply source 301 and the gas nozzle 303.

10. Seventh Embodiment

Next, a unit evaluation device, configured to evaluate whether or not a target generation device satisfies a required performance before the target generation device is mounted on the EUV light generation device, will be described in detail as a seventh embodiment with reference to the drawings. In the below description, constituent elements that are the same as the constituent elements described above are denoted by the same reference numerals, and the overlapping description is omitted.

10.1 Configuration

Figure 21:
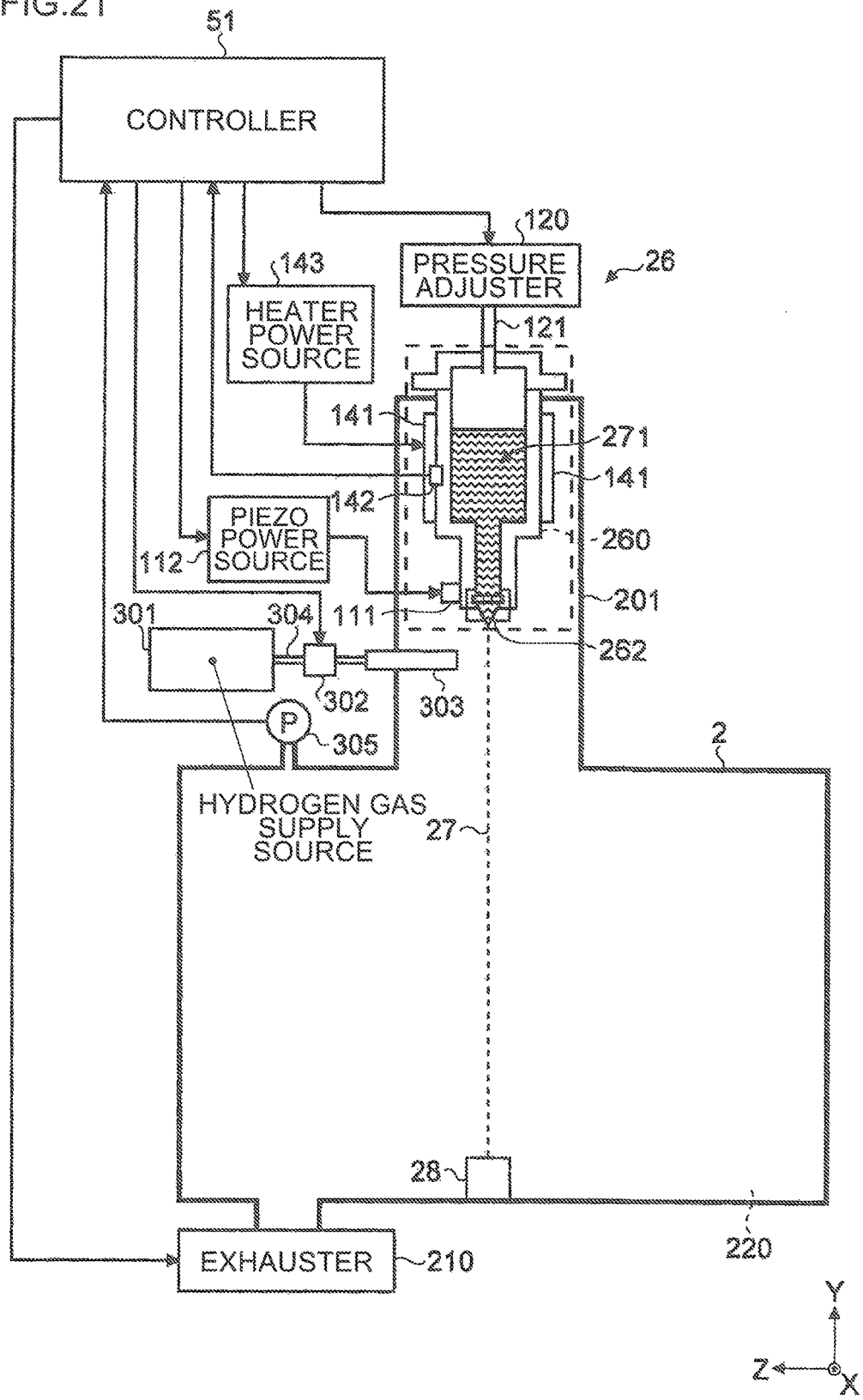
FIG. 21 is a schematic diagram illustrating an example of a schematic configuration of a target generation device according to a seventh embodiment.

FIG. 21 is a schematic diagram illustrating an example of a schematic configuration of the unit evaluation device according to the seventh embodiment. As illustrated in FIG. 21, in the unit evaluation device of the seventh embodiment, a configuration of radiating the pulse laser light 33 to the target 27 and a configuration of focusing and outputting EUV light 252 may be omitted from the same configuration as that of the EUV light generation device illustrated in FIG. 7, for example.

Specifically, in the configuration illustrated in FIG. 7, the laser device 3, the laser light travel direction controller 34, the laser focusing optical system 220, the EUV focusing mirror 23, and the connecting section 29 may be omitted, for example. The other part of the configuration may be the same as that of the EUV light generation device illustrated in FIG. 7.

10.2 Operation

An exemplary operation of the unit evaluation device illustrated in FIG. 21 may be the same as the exemplary operation described using FIGS. 8A, 8B, and 9 in the first embodiment, for example. In the seventh embodiment, the size, trajectory, cycle, and the like of the droplet (target 27) generated at step S113 of FIG. 8B may be monitored by a monitoring device not illustrated between the timings t4 and t5 of FIG. 9, and the monitoring result may be recorded. The target generation device may be evaluated based on the monitoring result. Further, it is also possible to include an image capturing device not illustrated that checks an oxide of the target material 271 adhering to the nozzle section 262 of the target supply unit 26 after the operation exemplarily illustrated in FIGS. 8A, 8B, and 9, and the target generation device may be evaluated based on the imaged data.

10.3 Effect

In the seventh embodiment, solidification can be made in a state where generation of a tin oxide film of the target material 271 is suppressed in the target generation device. Accordingly, it is possible to manufacture a target generation device in which an oxide is less likely to adhere to the vicinity of the nozzle hole. It should be noted that the surface oxidization of the solidified target material 271 can progress very slowly compared with the molten state. Accordingly, even in the case of transporting the target generation device operated in the device of the seventh embodiment while exposing it to the atmospheric air, less tin oxide is generated. It should be noted that the other effects may be the same as those of the embodiments described above.

11. Eighth Embodiment

Next, another exemplary operation of the EUV light generation device exemplarily illustrated in the first embodiment will be described in detail as an eighth embodiment, with reference to the drawings. In the below description, regarding the operation that is the same as that described above, overlapping description is omitted.

11.1 Configuration

Figure 22A:
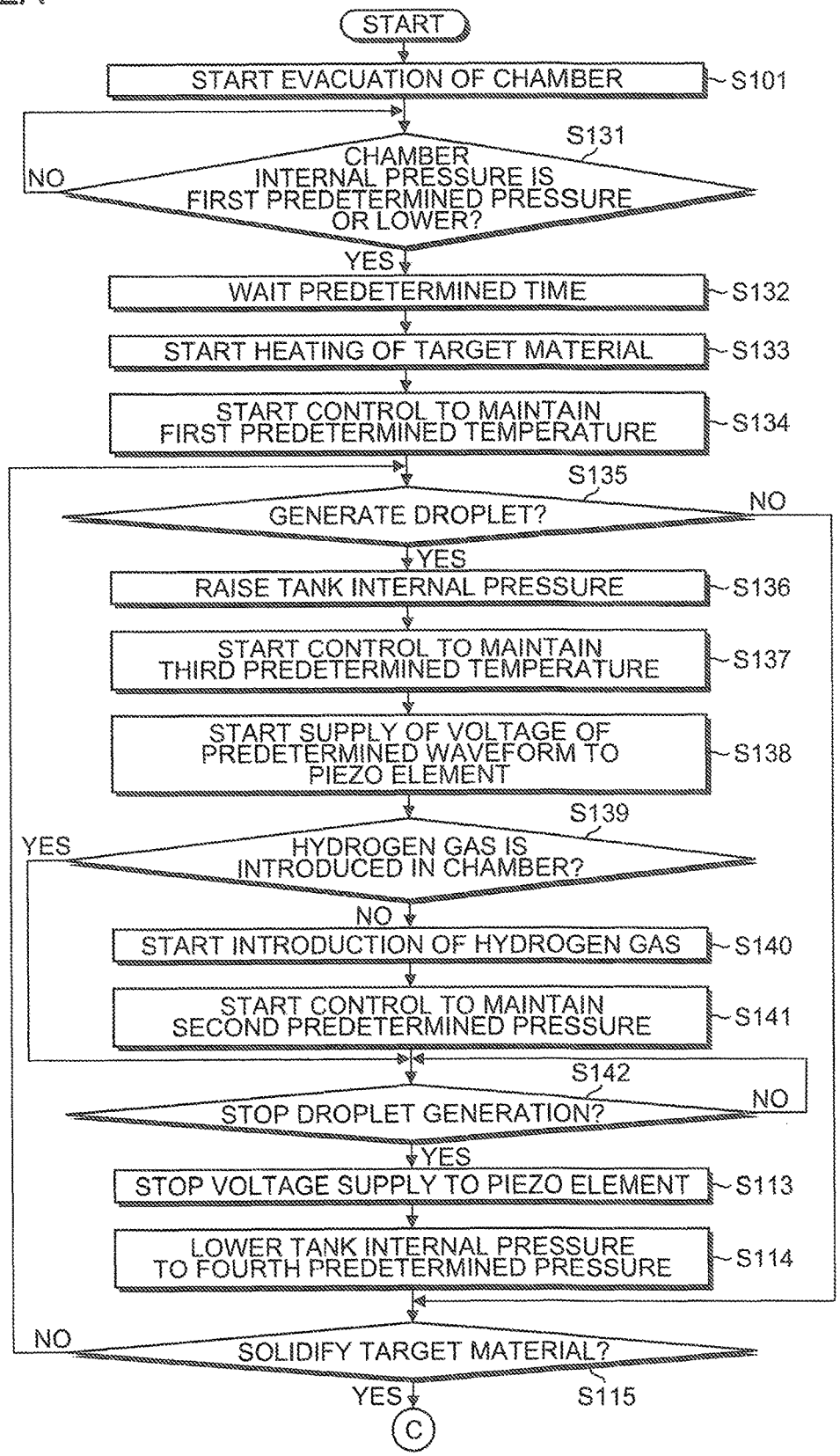
FIGS. 22A and 22B are flowcharts illustrating an exemplary operation according to an eighth embodiment of EUV light generation device illustrated in FIG. 7.
Figure 22B:
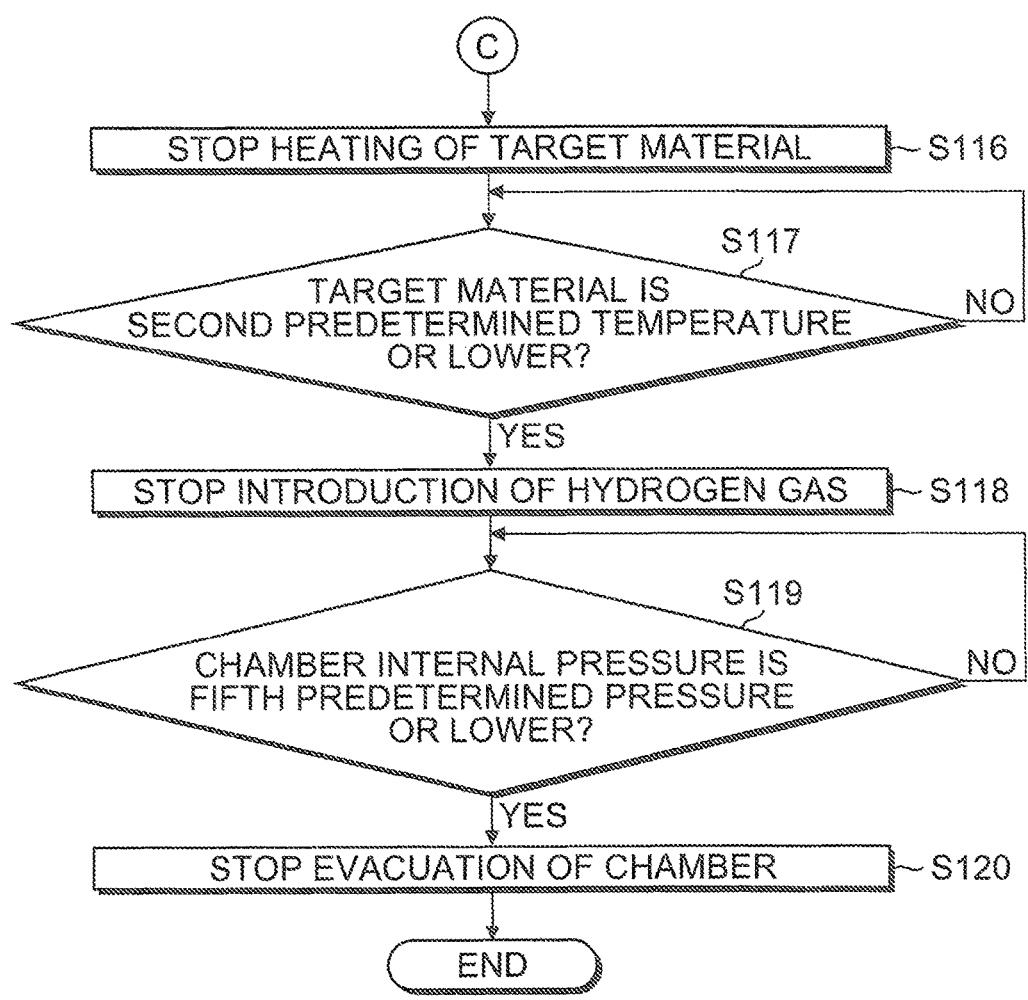

The EUV light generation device of the eighth embodiment may be the EUV light generation device illustrated in FIG. 7. However, in the EUV light generation device of the eighth embodiment, the target material 271 stored in the tank 260 may be in an ingot form before the operation illustrated in FIGS. 22A, 22B, and 23 is performed. Accordingly, spaces may exist between the target material 271 in an ingot form and the inner wall of the tank 260, and inside the nozzle section 262.

11.2 Operation

The EUV light generation device of the eighth embodiment may perform the operation illustrated in the flowchart of FIGS. 22A and 22B and the timing chart in FIG. 23, instead of the operation illustrated in the flowchart of FIGS. 8A and 8B and the timing chart of FIG. 9 of the first embodiment.

In the eighth embodiment, the controller 51 may start evacuation of the chamber 2, as in the first embodiment (step S101 of FIG. 22A). Then, when the chamber internal pressure becomes the first predetermined pressure or lower (step S131 of FIG. 22A; YES, timing t11 of FIG. 23), the controller 51 may wait until a predetermined time passes after the pressure becomes the first predetermined pressure or lower, as illustrated in step S132 of FIG. 22A. The predetermined time may be, for example, ten minutes or longer, for example.

After waiting the predetermined time, the controller 51 may operate the heater 141 in such a manner that the target material 271 in an ingot form is heated to the first predetermined temperature and melts, as illustrated in step S133 of FIG. 22A (timing t12 of FIG. 23). When the temperature of the target material 271 reaches the first predetermined temperature (timing t13 of FIG. 23), the controller 51 may maintain the temperature of the target material 271 at the first predetermined temperature, as illustrated in step S134 of FIG. 22A.

The controller 51 may refrain from starting generation of a droplet until it receives an instruction to start generation of a droplet from the exposure device 6 (step S135 of FIG. 22A; NO), and move on to step S115 of FIG. 22A. Then, upon receipt of an instruction to start generation of a droplet from the exposure device 6, the controller 51 may determine to generate a droplet of the target material 271 based on the instruction (step S135 of FIG. 22A; YES).

When the controller 51 determines to generate a droplet of the target material 271, the controller may control the pressure adjuster 120 in such a manner that the tank internal pressure becomes the third predetermined pressure, as illustrated in step S136 of FIG. 22A. The controller 51 may also control the pressure adjuster 120 in such a manner that the tank internal pressure is maintained at the third predetermined pressure, as illustrated in step S137 of FIG. 22A.

Then, as illustrated in step S138 of FIG. 22A, the controller 51 may apply voltage of a predetermined waveform to the piezo element 111 via the piezo power source 112 (timing t14 of FIG. 23).

Thereby, the target material 271 can be output in a droplet form from the nozzle section 262.

After the target 27 in a droplet form is output from the nozzle section 262, the controller 51 may determine whether or not hydrogen gas is introduced in the chamber 2, as illustrated in step S139 of FIG. 22A.

In the case where hydrogen gas is introduced in the chamber 2 (step S139 of FIG. 22A; YES), the controller 51 may move on to step S142 of FIG. 22A.

In the case where hydrogen gas is not introduced in the chamber 2 (step S139 of FIG. 22A; NO), the controller 51 may start introduction of hydrogen gas from the hydrogen gas supply source 301 into the chamber 2, as illustrated in step S140 of FIG. 22A (timing t15 of FIG. 23). Hydrogen gas may be introduced into the chamber 2 at a low flow rate.

Then, as illustrated in step S141 of FIG. 22A, the controller 51 may control the flow rate adjuster 302 such that the value of the pressure sensor 305 is maintained at the second predetermined pressure.

Then, the controller 51 may maintain output of droplets until it receives an instruction to stop generation of droplets from the exposure device 6 (step S142 of FIG. 22A; NO). Upon receipt of an instruction to stop generation of droplets from the exposure device 6, the controller 51 may determine to stop generation of droplets of the target material 271 based on the instruction (step S142 of FIG. 22A; YES).

When the controller 51 determines to stop generation of droplets of the target material 271, the controller 51 may stop applying voltage to the piezo element 111, as in the first embodiment (step S113 of FIG. 22A, timing t16 of FIG. 23).

Then, the controller 51 may perform processing of steps S114 to S120 that are the same as the steps of the first embodiment.

11.3 Effect

As described above, in the eighth embodiment, the target material 271 in the tank 260 may be in an ingot form before the operation of FIGS. 22A, 22B, and 23 is performed. Spaces may exist between the target material 271 in an ingot form and the inner wall of the tank 260, and inside the nozzle section 262. In such spaces, oxygen may exist.

In this state, when hydrogen gas is introduced into the chamber 2 and the hydrogen gas enters the inside of the nozzle section 262 and the inside of the tank 260 from the nozzle hole, the oxygen and the hydrogen existing in the spaces may react with each other to generate moisture.

Further, on the inner wall of the nozzle hole, on the inner wall of the nozzle section 262, and on the inner wall of the tank 260, an oxide film that can be deoxidized by the hydrogen gas may be formed. An oxide film that can be deoxidized by the hydrogen gas may be an oxide film of copper (Cu), iron (Fe), nickel (Ni), molybdenum (Mo), or tungsten (W), for example.

An oxide film formed on the inner wall of the nozzle hole, on the inner wall of the nozzle section 262, and on the inner wall of the tank 260 can be deoxidized by the hydrogen gas entering from the nozzle hole to the inside of the nozzle section 262 and the inside of the tank 260. Due to deoxidization of the oxide film, moisture may be generated.

The moisture generated in the nozzle section 262 and the tank 260 may not be exhausted. In that case, when the target material 271 is output from the nozzle hole as a droplet, the target material 271 and the moisture may react with each other to form an oxide. The formed oxide may cause clogging of the nozzle hole.

Even in the case where the moisture generated in the tank 260 and the nozzle section 262 is exhausted, as the inner diameter of the nozzle hole is several um, it may take time to exhaust the moisture from the nozzle hole.

Meanwhile, in the eighth embodiment described above, the controller 51 may introduce hydrogen gas into the chamber 2, after allowing the target material 271 in an ingot form stored in the tank 260 to melt and outputting it as a droplet from the nozzle hole. At that time, as a droplet is output from the nozzle hole, the hydrogen gas in the chamber 2 can be less likely to enter the inside of the nozzle section 262 from the nozzle hole.

Thereby, in the nozzle section 262 and the tank 260, moisture can be less likely to be generated.

Consequently, formation of an oxide due to a reaction between the target material 271 and the moisture as described above can be suppressed, whereby clogging of the nozzle hole can be suppressed.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to include". A term "have" should be construed as "not limited to that described to be held". Moreover, a modifier "a/an" described in the present description and in the accompanying claims should be construed to mean "at least one" or "one or more".

What is claimed is:

1. A chamber device comprising:
   a chamber;
   a target generation device assembled into the chamber, the target generation device being configured to supply a target material to a predetermined region in the chamber, the target generation device including:
      a tank configured to store the target material;
      a temperature variable device configured to vary temperature of the target material in the tank, the temperature variable device including a heater configured to heat the target material in the tank and a heater power source configured to supply electric current to the heater; and
      a nozzle section in which a nozzle hole configured to output the target material in a liquid state is formed;
   a gas nozzle having an inlet port facing the nozzle section, the inlet port of the gas nozzle being configured to introduce gas into the chamber;
   a gas supply source configured to supply gas containing hydrogen to the gas nozzle such that the gas containing the hydrogen is supplied to at least periphery of the nozzle section; and
   a moisture remover configured to remove moisture at least in the periphery of the nozzle section in the chamber.

2. The chamber device according to claim 1, further comprising
   a cover member configured to cover at least the nozzle section in the chamber, wherein
   the inlet port of the gas nozzle is positioned inside the cover member.

3. The chamber device according to claim 2, further comprising
   a catalyst disposed in the cover member, the catalyst promoting a reaction between the hydrogen and oxygen.

4. The chamber device according to claim 2, further comprising:
   a gas pipe connecting the gas nozzle and the gas supply source; and
   a catalyst disposed in the gas pipe, the catalyst promoting a reaction between the hydrogen and oxygen.

5. The chamber device according to claim 2, further comprising a heat source disposed in the cover member, the heat source being configured to raise a temperature of the gas containing the hydrogen in the periphery of the nozzle section.

6. The chamber device according to claim 1, wherein
   the moisture remover is an exhauster configured to evacuate the chamber.

7. The chamber device according to claim 1, wherein
   the moisture remover includes at least one of a dry vacuum pump, a turbo molecular pump, a cryopump, and a low temperature trap.

8. The chamber device according to claim 1, further comprising
   a controller configured to control the gas supply source, the temperature variable device, and the moisture remover, wherein
   after controlling the gas supply source to start supply of the gas containing the hydrogen and controlling the moisture remover to start removal of the moisture in the periphery of the nozzle section, the controller controls the temperature variable device to raise the temperature of the target material in the tank to allow the target material to melt.

9. The chamber device according to claim 8, wherein
   after controlling the temperature variable device to lower the temperature of the molten target material in the tank to solidify the target material, the controller controls the gas supply source to stop supply of the gas containing the hydrogen, and controls the moisture remover to stop removal of the moisture.

10. The chamber device according to claim 1, further comprising
    a controller configured to control the gas supply source, the temperature variable device, and the moisture remover, wherein
    after controlling the moisture remover to start removal of the moisture in the periphery of the nozzle section, and controlling the temperature variable device to raise the temperature of the target material in the tank so as to allow the target material to melt and allow the molten target material in the tank to be output from the nozzle hole, the controller controls the gas supply source to start supply of the gas containing the hydrogen.

11. A target generation method using a device, the device including:
    a chamber;
    a target generation device assembled into the chamber, the target generation device being configured to supply a target material to a predetermined region in the chamber, the target generation device including a tank configured to store the target material, a temperature variable device configured to vary temperature of the target material in the tank, the temperature variable device including a heater configured to heat the target material in the tank and a heater power source configured to supply electric current to the heater, and a nozzle section in which a nozzle hole configured to output the target material in a liquid state is formed;
    a gas nozzle having an inlet port facing the nozzle section, the inlet port of the gas nozzle being configured to introduce gas into the chamber;
    a gas supply source configured to supply gas containing hydrogen to the gas nozzle such that the gas containing the hydrogen is supplied to at least periphery of the nozzle section;

a moisture remover configured to remove moisture at least in the periphery of the nozzle section in the chamber; and a controller configured to control the gas supply source, the temperature variable device, and the moisture remover, the method comprising:

(a) controlling the gas supply source to start supply of the gas containing the hydrogen by the controller;

(b) controlling the moisture remover to start removal of the moisture in the periphery of the nozzle section by the controller; and (c) controlling the temperature variable device to raise the temperature of the target material in the tank to allow the target material to melt by the controller, after the steps (a) and (b).

12. The target generation method according to claim 11, further comprising:

(d) controlling the temperature variable device to lower the temperature of the molten target material in the tank to solidify the target material by the controller; and (e) controlling the gas supply source to stop supply of the gas containing the hydrogen, and controlling the moisture remover to stop removal of the moisture by the controller, after the step (d).

13. A target generation method using a device, the device including:

a chamber;

a target generation device assembled into the chamber, the target generation device being configured to supply a target material to a predetermined region in the chamber, the target generation device including a tank configured to store the target material, a temperature variable device configured to vary temperature of the target material in the tank, the temperature variable device including a heater configured to heat the target material in the tank and a heater power source configured to supply electric current to the heater, and a nozzle section in which a nozzle hole configured to output the target material in a liquid state is formed;

a gas nozzle having an inlet port facing the nozzle section, the inlet port of the gas nozzle being configured to introduce gas into the chamber;

a gas supply source configured to supply gas containing hydrogen to the gas nozzle such that the gas containing the hydrogen is supplied to at least periphery of the nozzle section;

a moisture remover configured to remove moisture at least in the periphery of the nozzle section in the chamber; and a controller configured to control the gas supply source, the temperature variable device, and the moisture remover, the method comprising:

(a) controlling the moisture remover to start removal of the moisture in the periphery of the nozzle section by the controller;

(b) controlling the temperature variable device to raise the temperature of the target material in the tank so as to allow the target material to melt and allow the molten target material in the tank to be output from the nozzle hole by the controller; and (c) controlling the gas supply source to start supply of the gas containing the hydrogen by the controller, after the steps (a) and (b).

14. An extreme ultraviolet light generation system comprising:

a chamber;

a target generation device assembled into the chamber, the target generation device being configured to supply a target material to a predetermined region in the chamber; the target generation device including:

a tank configured to store the target material;

a temperature variable device configured to vary temperature of the target material in the tank, the temperature variable device including a heater configured to heat the target material in the tank and a heater power source configured to supply electric current to the heater; and a nozzle section in which a nozzle hole configured to output the target material in a liquid state is formed;

a gas nozzle having an inlet port facing the nozzle section, the inlet port of the gas nozzle being configured to introduce gas into the chamber;

a gas supply source configured to supply gas containing hydrogen to the gas nozzle such that the gas containing the hydrogen is supplied to at least periphery of the nozzle section;

a moisture remover configured to remove moisture at least in the periphery of the nozzle section in the chamber;

a laser device configured to radiate laser light to the target material supplied into the chamber; and a focusing mirror configured to condense and output extreme ultraviolet light emitted from plasma of the target material generated by being irradiated with the laser light.

* * * * *